United States Patent
Asaba et al.

(10) Patent No.: US 11,769,800 B2
(45) Date of Patent: Sep. 26, 2023

(54) SEMICONDUCTOR DEVICE

(71) Applicants: TOSHIBA ELECTRONIC DEVICES & STORAGE CORPORATION, Tokyo (JP); KABUSHIKI KAISHA TOSHIBA, Tokyo (JP)

(72) Inventors: Shunsuke Asaba, Himeji Hyogo (JP); Hiroshi Kono, Himeji Hyogo (JP)

(73) Assignees: Toshiba Electronic Devices & Storage Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 223 days.

(21) Appl. No.: 17/464,604

(22) Filed: Sep. 1, 2021

(65) Prior Publication Data

US 2022/0190118 A1 Jun. 16, 2022

(30) Foreign Application Priority Data

Dec. 15, 2020 (JP) ................... 2020-207693

(51) Int. Cl.
*H01L 29/78* (2006.01)
*H01L 29/16* (2006.01)
*H01L 27/088* (2006.01)

(52) U.S. Cl.
CPC ........ *H01L 29/1608* (2013.01); *H01L 27/088* (2013.01); *H01L 29/7827* (2013.01)

(58) Field of Classification Search
CPC ............. H01L 29/0696; H01L 29/4238; H01L 27/088; H01L 29/1608; H01L 29/7802; H01L 29/7805; H01L 29/7806; H01L 29/7827; H01L 2224/0603
See application file for complete search history.

(56) References Cited

U.S. PATENT DOCUMENTS

| | | | | |
|---|---|---|---|---|
| 7,075,147 B2 * | 7/2006 | Cao | ..................... | H01L 29/0696 257/E29.136 |
| 7,622,755 B2 * | 11/2009 | Pong | ................... | H01L 29/4238 257/E27.081 |
| 8,080,847 B2 * | 12/2011 | Leibiger | ............. | H01L 29/7835 257/E29.264 |
| 9,741,838 B2 | 8/2017 | Nishikawa et al. | | |

(Continued)

FOREIGN PATENT DOCUMENTS

| | | |
|---|---|---|
| JP | 2003-197910 A | 7/2003 |
| JP | 5211666 B2 | 6/2013 |

(Continued)

*Primary Examiner* — Eric A. Ward
(74) *Attorney, Agent, or Firm* — Kim & Stewart LLP

(57) ABSTRACT

A semiconductor device of embodiments includes a first gate electrode, a second gate electrode, a third gate electrode extending in a first direction, and a gate wiring line extending in a second direction crossing the first direction and to which the first to the third gate electrodes are connected. Assuming distance between the first and the second gate electrode in the second direction in a first region is S1, distance between the first and the second gate electrode in the second direction in a second region closer to the gate wiring line than the first region is S2, distance between the second and the third gate electrode in the second direction in the first region is S3, and distance between the second and the third gate electrode in the second direction in the second region is S4, following Expressions are satisfied, $$S1<S3,\ S1<S2,\ S3>S4.$$

14 Claims, 19 Drawing Sheets

(56) References Cited

U.S. PATENT DOCUMENTS

| | | |
|---|---|---|
| 2010/0224886 A1 | 9/2010 | Iwamuro |
| 2016/0079411 A1 | 3/2016 | Hino et al. |
| 2020/0020796 A1 | 1/2020 | Hoshi et al. |
| 2020/0185496 A1* | 6/2020 | Chun .................. H01L 29/1095 |

FOREIGN PATENT DOCUMENTS

| | | |
|---|---|---|
| JP | 2017-135245 A | 8/2017 |
| WO | 2014162969 A1 | 10/2014 |

* cited by examiner

AA' CROSS SECTION
SECOND DIRECTION

BB' CROSS SECTION
SECOND DIRECTION

DD' CROSS SECTION
SECOND DIRECTION

SEMICONDUCTOR DEVICE

CROSS-REFERENCE TO RELATED APPLICATION

This application is based upon and claims the benefit of priority from Japanese Patent Application No. 2020-207693, filed on Dec. 15, 2020, the entire contents of which are incorporated herein by reference.

FIELD

Embodiments described herein relate generally to a semiconductor device.

BACKGROUND

Silicon carbide is expected as a material for next-generation semiconductor devices. Silicon carbide has excellent physical properties, such as a bandgap of 3 times that of silicon, a breakdown field strength of about 10 times that of silicon, and a thermal conductivity of about 3 times that of silicon. By using such characteristics, for example, it is possible to realize a metal oxide semiconductor field effect transistor (MOSFET) that has a high breakdown voltage and low loss and that can operate at high temperature.

For example, a plurality of gate electrodes arranged in a stripe pattern are provided in the MOSFET. The plurality of gate electrodes are connected to, for example, one gate wiring line, and a gate voltage is applied to the gate wiring line to drive the MOSFET.

As the scaling-down of the MOSFET progresses, there arises a problem that, for example, at a connection portion where a plurality of gate electrodes are connected to the gate wiring line, an interlayer insulating layer becomes thinner and the leakage current of the interlayer insulating layer becomes larger. For this reason, it becomes difficult to scale down the MOSFET.

DETAILED DESCRIPTION

Figure 1:
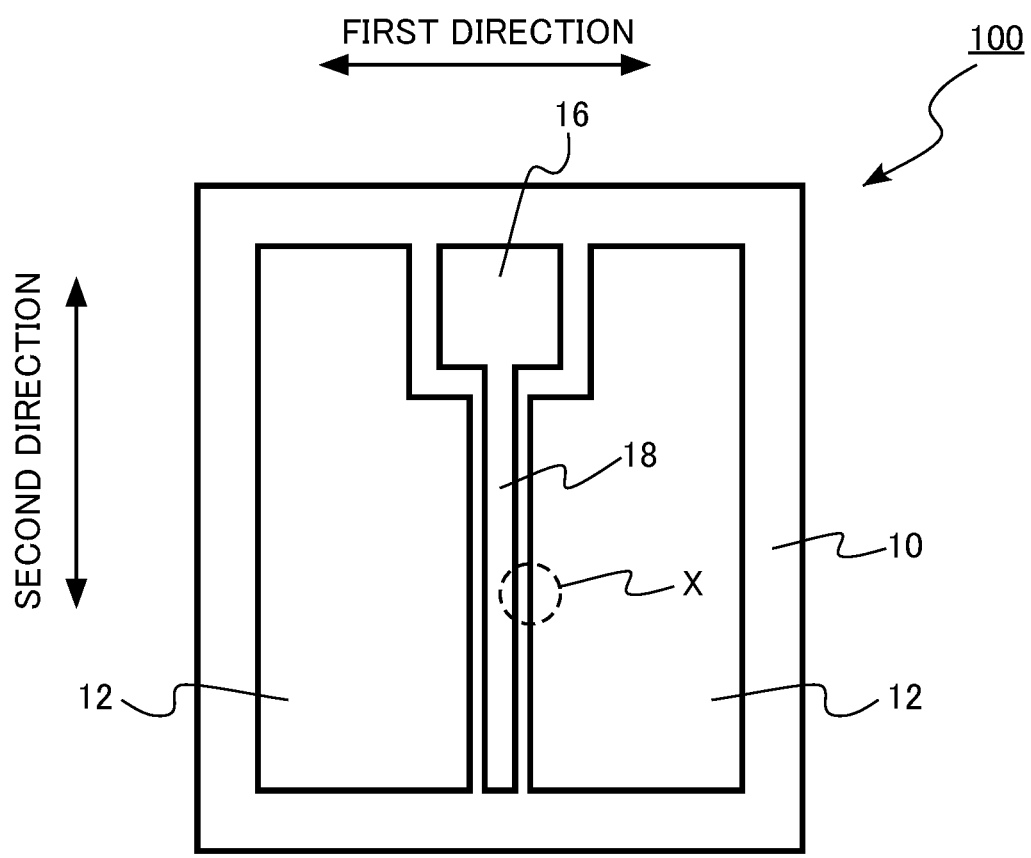
FIG. 1 is a schematic top view of a semiconductor device of a first embodiment.

A semiconductor device of embodiments includes: a first electrode; a second electrode; a silicon carbide layer provided between the first electrode and the second electrode and including a first silicon carbide region of a first conductive type, a second silicon carbide region of a second conductive type provided between the first electrode and the first silicon carbide region, and a third silicon carbide region of the first conductive type provided between the first electrode and the second silicon carbide region; a first gate electrode provided between the first electrode and the silicon carbide layer and extending in a first direction; a second gate electrode provided between the first electrode and the silicon carbide layer and extending in the first direction; a third gate electrode provided between the first electrode and the silicon carbide layer and extending in the first direction; a gate wiring line provided between the first electrode and the silicon carbide layer and extending in a second direction crossing the first direction, the first gate electrode, the second gate electrode, and the third gate electrode being connected to the gate wiring line; and a gate insulating layer provided between the first gate electrode and the silicon carbide layer, between the second gate electrode and the silicon carbide layer, and between the third gate electrode and the silicon carbide layer. Assuming that a distance between the first gate electrode and the second gate electrode in the second direction in a first region is S1, a distance between the first gate electrode and the second gate electrode in the second direction in a second region closer to the gate wiring line than the first region is S2, a distance between the second gate electrode and the third gate electrode in the second direction in the first region is S3, and a distance between the second gate electrode and the third gate electrode in the second direction in the second region is S4, following Expression 1, Expression 2, and Expression 3 are satisfied.

$$S1<S3 \qquad \text{(Expression 1)}$$

$$S1<S2 \qquad \text{(Expression 2)}$$

$$S3>S4 \qquad \text{(Expression 3)}$$

Hereinafter, embodiments will be described with reference to the diagrams. In the following description, the same or similar members and the like are denoted by the same reference numerals, and the description of the members and the like once described may be omitted as appropriate. In addition, in the following description, when there are notations of n$^+$, n, n$^-$, p$^+$, p, and p$^-$, these are assumed to indicate the relative high and low of the impurity concentration in each conductive type. That is, n$^+$ indicates that the n-type impurity concentration is relatively higher than n, and n$^-$ indicates that the n-type impurity concentration is relatively lower than n. In addition, p$^+$ indicates that the p-type impurity concentration is relatively higher than p, and p$^-$ indicates that the p-type impurity concentration is relatively lower than p. In addition, n$^+$-type and n$^-$-type may be simply described as n-type, p$^+$-type and p$^-$-type may be simply described as p-type.

The impurity concentration can be measured by, for example, secondary ion mass spectrometry (SIMS). In addition, the relative difference of the impurity concentration can be determined from, for example, the difference of the carrier concentration obtained by scanning capacitance microscopy (SCM). In addition, the distance such as the depth and thickness of an impurity region can be calculated by, for example, SIMS. In addition, the distance such as the depth, thickness, and width of an impurity region and a distance between impurity regions can be calculated, for example, by using an SCM image and SIMS measurement results. In addition, the width of a conductive layer, a distance between conductive layers, the thickness of an insulating layer, and the like can be measured on, for example, an image of a scanning electron microscope (SEM) or a transmission electron microscope (TEM).

First Embodiment

A semiconductor device of a first embodiment includes: a first electrode; a second electrode; a silicon carbide layer provided between the first electrode and the second electrode and including a first silicon carbide region of a first conductive type, a second silicon carbide region of a second conductive type provided between the first electrode and the first silicon carbide region, and a third silicon carbide region of a first conductive type provided between the first electrode and the second silicon carbide region; a first gate electrode provided between the first electrode and the silicon carbide layer and extending in a first direction; a second gate electrode provided between the first electrode and the silicon carbide layer and extending in the first direction; a third gate electrode provided between the first electrode and the silicon carbide layer and extending in the first direction; a gate wiring line provided between the first electrode and the silicon carbide layer and extending in a second direction crossing the first direction, the first gate electrode, the second gate electrode, and the third gate electrode being connected to the gate wiring line; and a gate insulating layer provided between the first gate electrode and the silicon carbide layer, between the second gate electrode and the silicon carbide layer, and between the third gate electrode and the silicon carbide layer. Assuming that a distance between the first gate electrode and the second gate electrode in the second direction in a first region is S1, a distance between the first gate electrode and the second gate electrode in the second direction in a second region closer to the gate wiring line than the first region is S2, a distance between the second gate electrode and the third gate electrode in the second direction in the first region is S3, and a distance between the second gate electrode and the third gate electrode in the second direction in the second region is S4, following Expression 1, Expression 2, and Expression 3 are satisfied.

$$S1<S3 \quad \text{(Expression 1)}$$

$$S1<S2 \quad \text{(Expression 2)}$$

$$S3>S4 \quad \text{(Expression 3)}$$

Figure 2:
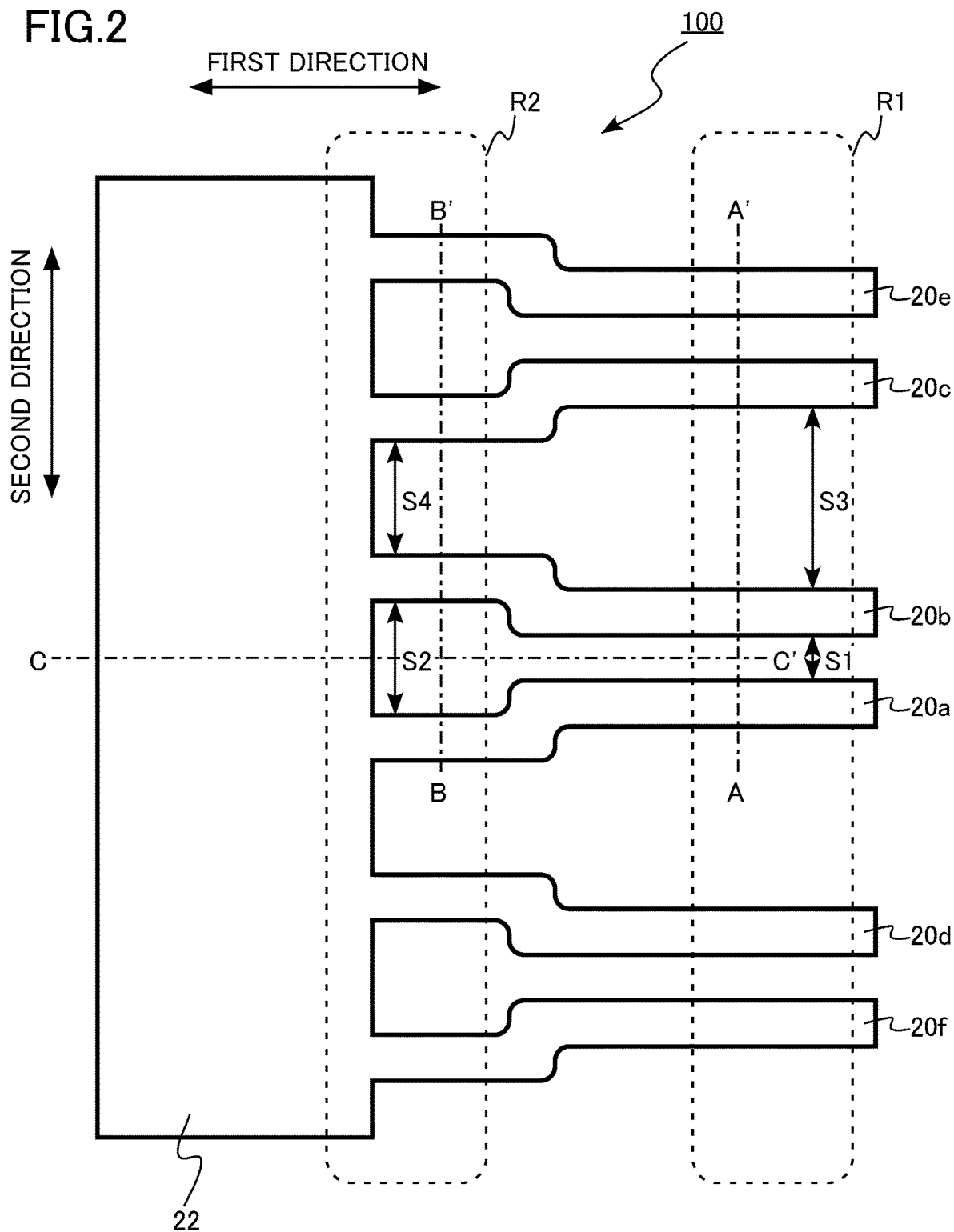
FIG. 2 is an enlarged schematic top view of the semiconductor device of the first embodiment.

FIG. 1 is a schematic top view of the semiconductor device of the first embodiment. FIG. 2 is an enlarged schematic top view of the semiconductor device of the first embodiment. FIG. 2 is an enlarged view of a region X surrounded by the dotted line in FIG. 1. FIG. 2 shows a pattern layout of a gate electrode and a gate wiring line.

Figure 3:
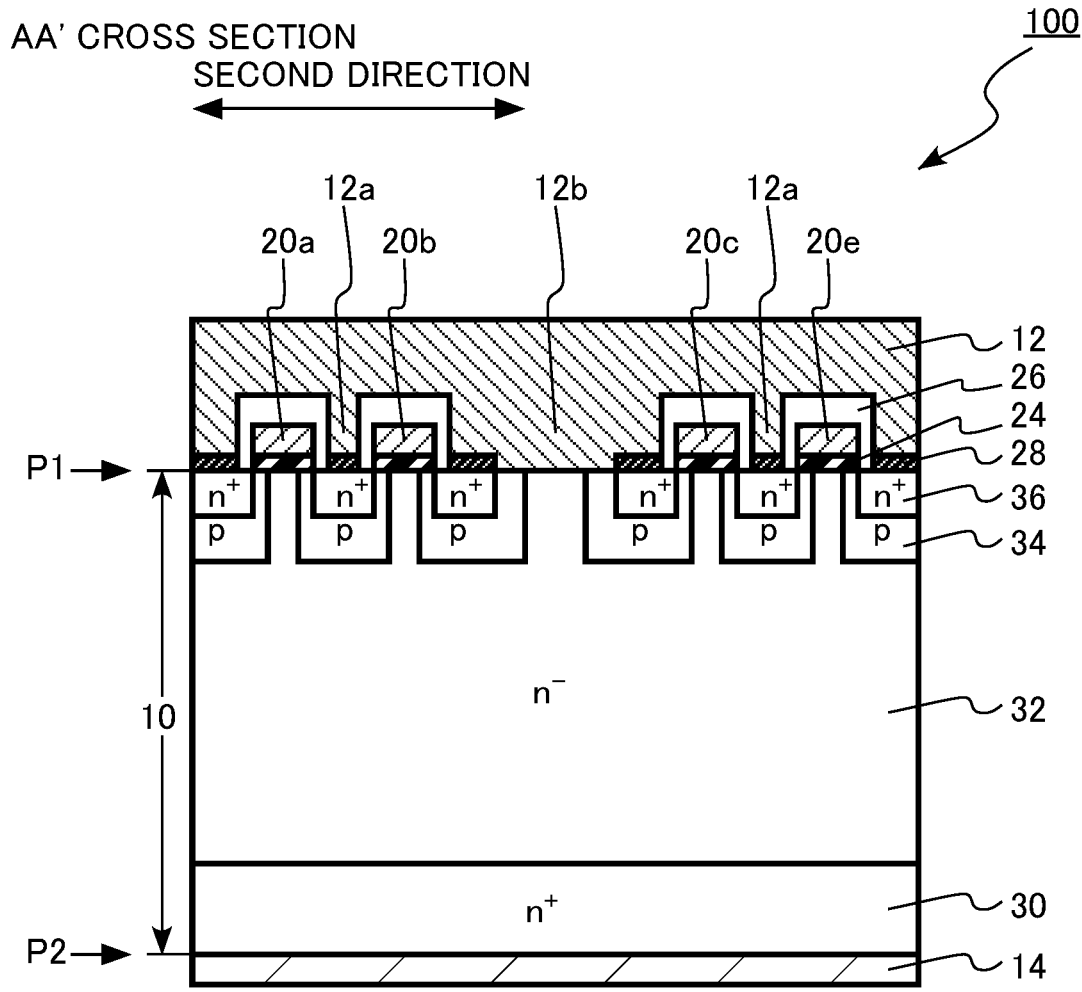
FIG. 3 is an enlarged schematic cross-sectional view of the semiconductor device of the first embodiment.
Figure 4:
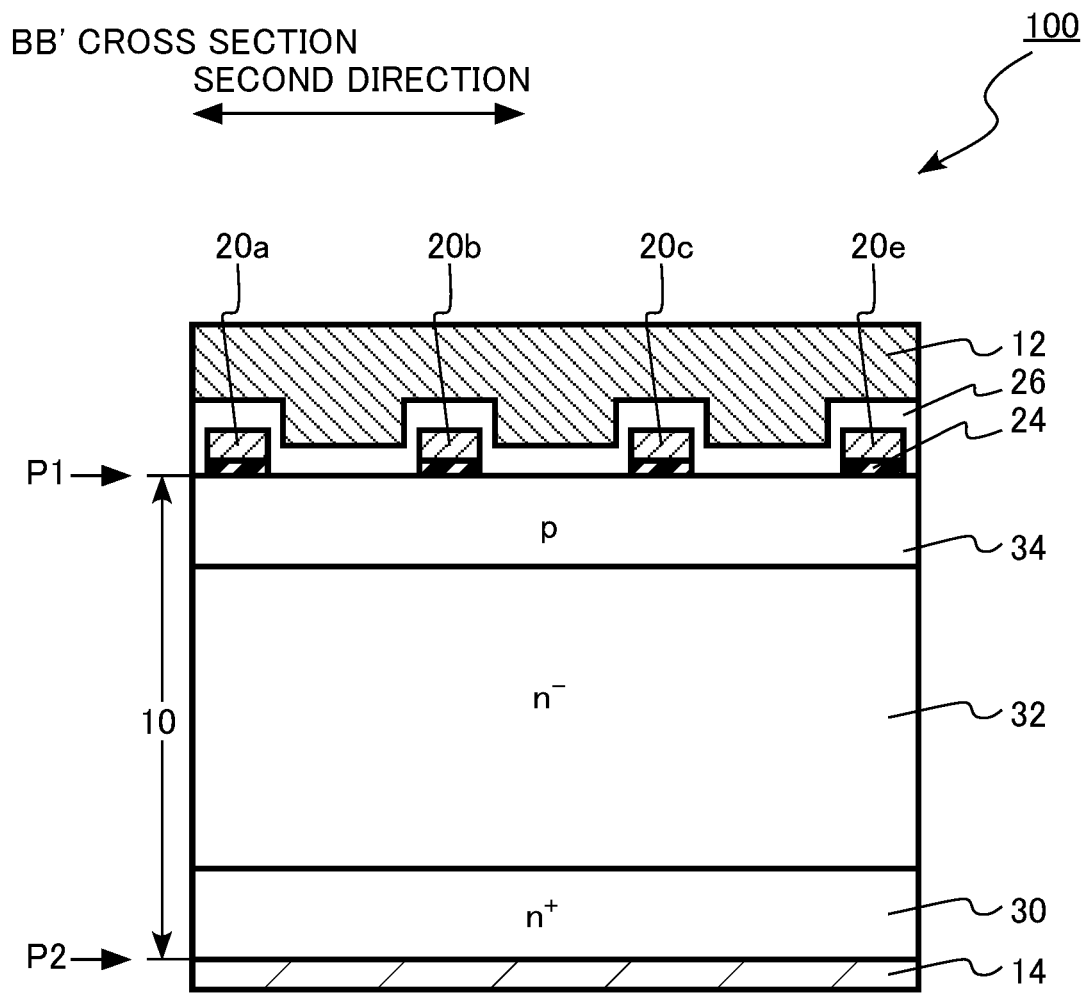
FIG. 4 is an enlarged schematic cross-sectional view of the semiconductor device of the first embodiment.
Figure 5:
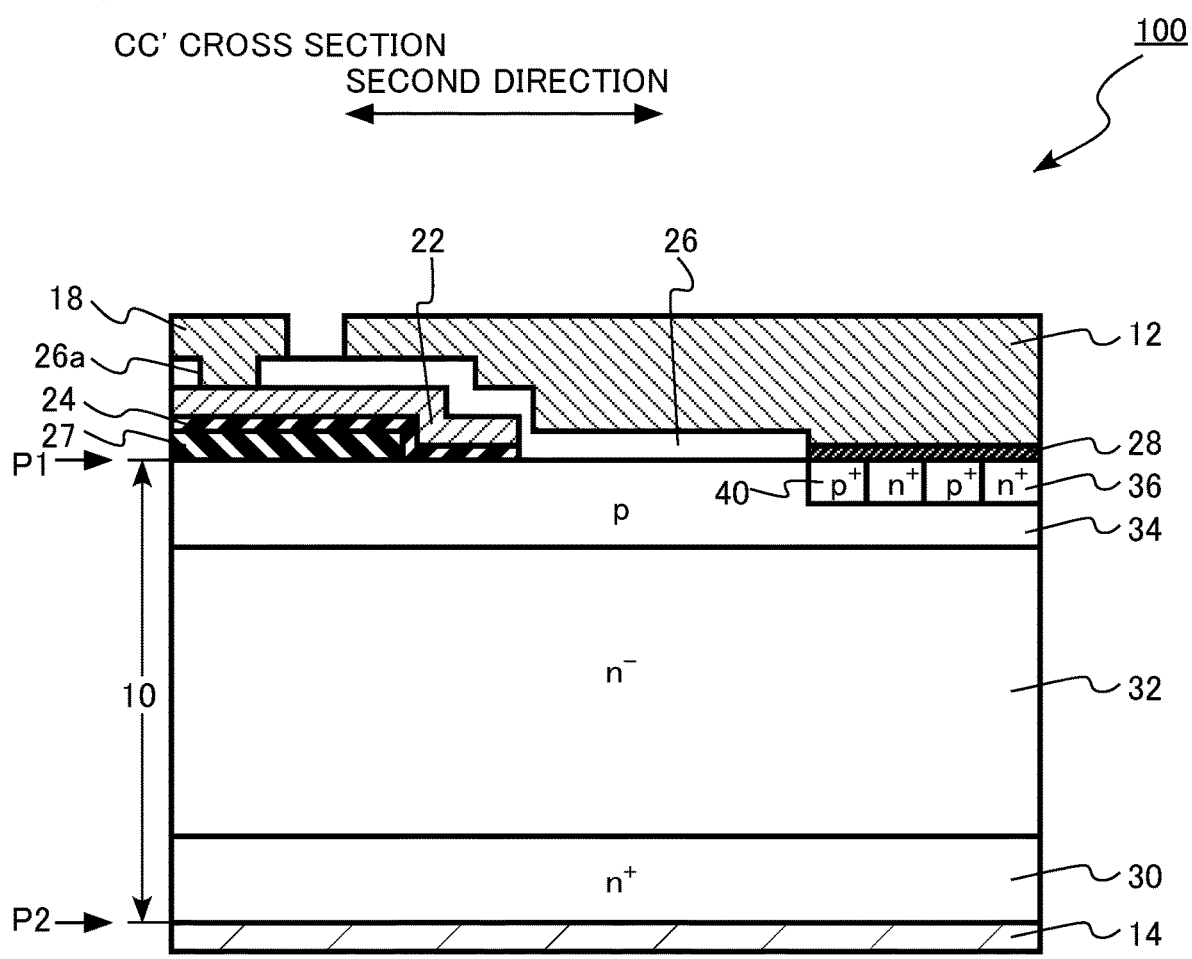
FIG. 5 is an enlarged schematic cross-sectional view of the semiconductor device of the first embodiment.

FIGS. 3, 4, and 5 are enlarged schematic cross-sectional views of the semiconductor device of the first embodiment. FIG. 3 is a cross-sectional view taken along the line AA' of FIG. 2. FIG. 4 is a cross-sectional view taken along the line BB' of FIG. 2. FIG. 5 is a cross-sectional view taken along the line CC' of FIG. 2.

The semiconductor device of the first embodiment is a planar gate type vertical MOSFET 100 using silicon carbide. The MOSFET 100 is, for example, a double implantation MOSFET (DIMOSFET) in which a body region and a source region are formed by ion implantation. In addition, the MOSFET 100 includes a Schottky barrier diode (SBD) as a built-in diode.

Hereinafter, a case where the first conductive type is n type and the second conductive type is p type will be described as an example. The MOSFET 100 is a vertical n-channel MOSFET having electrons as carriers.

The MOSFET 100 includes a silicon carbide layer 10, a source electrode 12 (first electrode), a drain electrode 14 (second electrode), a gate electrode pad 16, a metal wiring line 18, a first gate electrode 20a, a second gate electrode 20b, a third gate electrode 20c, a fourth gate electrode 20d, a fifth gate electrode 20e, a sixth gate electrode 20f, a gate wiring line 22, a gate insulating layer 24, an interlayer insulating layer 26, a field insulating layer 27, and a silicide layer 28. The source electrode 12 has a first portion 12a and a second portion 12b. The interlayer insulating layer 26 has a contact hole 26a.

Hereinafter, the first gate electrode 20a, the second gate electrode 20b, the third gate electrode 20c, the fourth gate electrode 20d, the fifth gate electrode 20e, and the sixth gate electrode 20f may be simply referred to collectively as a gate electrode 20.

The silicon carbide layer 10 includes an n$^+$-type drain region 30, an n$^-$-type drift region 32 (first silicon carbide region), a p-type body region 34 (second silicon carbide region), an n$^+$-type source region 36 (third silicon carbide region), and a p$^+$-type body contact region 40.

The silicon carbide layer 10 is provided between the source electrode 12 and the drain electrode 14. The silicon carbide layer 10 is a single crystal SiC. The silicon carbide layer 10 is, for example, 4H—SiC.

The silicon carbide layer 10 includes a first face ("P1" in FIG. 3) and a second face ("P2" in FIG. 3). Hereinafter, the "depth" means a depth with respect to the first face P1. The first face P1 is the surface of the silicon carbide layer 10, and the second face P2 is the back surface of the silicon carbide layer 10.

The first face P1 is, for example, a face inclined by an angle equal to or more than 0° and equal to or less than 8° with respect to the (0001) face. In addition, the second face P2 is, for example, a face inclined by an angle equal to or more than 0° and equal to or less than 8° with respect to the (000-1) face. The (0001) face is referred to as a silicon face. The (000-1) face is referred to as a carbon face.

The n+-type drain region 30 is provided on the side of the second face P2 in the silicon carbide layer 10. The drain region 30 contains, for example, nitrogen (N) as an n-type impurity. The n-type impurity concentration in the drain region 30 is, for example, equal to or more than $1\times10^{18}$ cm$^{-3}$ and equal to or less than $1\times10^{21}$ cm$^{-3}$.

The drain region 30 is electrically connected to the drain electrode 14.

The n−-type drift region 32 is provided between the source electrode 12 and the drain region 30. The drift region 32 is provided between the drain region 30 and the first face P1. The drift region 32 is provided on the drain region 30.

The drift region 32 contains, for example, nitrogen (N) as an n-type impurity. The n-type impurity concentration in the drift region 32 is lower than the n-type impurity concentration in the drain region 30. The n-type impurity concentration in the drift region 32 is, for example, equal to or more than $4\times10^{14}$ cm$^{-3}$ and equal to or less than $1\times10^{17}$ cm$^{-3}$. The thickness of the drift region 32 is, for example, equal to or more than 4 μm and equal to or less than 150 μm.

The p-type body region 34 is provided between the source electrode 12 and the drift region 32. The body region 34 is provided between the drift region 32 and the first face P1. The body region 34 functions as a channel region of the MOSFET 100.

The body region 34 contains, for example, aluminum (Al) as a p-type impurity. The p-type impurity concentration in the body region 34 is, for example, equal to or more than $1\times10^{17}$ cm$^{-3}$ and equal to or less than $5\times10^{18}$ cm$^{-3}$.

The depth of the body region 34 is, for example, equal to or more than 0.3 μm and equal to or less than 0.8 μm.

The body region 34 is electrically connected to the source electrode 12. The electric potential of the body region 34 is fixed to the electric potential of the source electrode 12.

The n+-type source region 36 is provided between the source electrode 12 and the body region 34. The source region 36 is provided between the body region 34 and the first face P1.

The source region 36 contains, for example, phosphorus (P) as an n-type impurity. The n-type impurity concentration in the source region 36 is higher than the n-type impurity concentration in the drift region 32.

The n-type impurity concentration in the source region 36 is, for example, equal to or more than $5\times10^{18}$ cm$^{-3}$ and equal to or less than $1\times10^{21}$ cm$^{-3}$. The depth of the source region 36 is smaller than the depth of the body region 34. The depth of the source region 36 is, for example, equal to or more than 0.1 μm and equal to or less than 0.3 ∞m.

The source region 36 is electrically connected to the source electrode 12. The electric potential of the source region 36 is fixed to the electric potential of the source electrode 12.

The p+-type body contact region 40 is provided between the source electrode 12 and the body region 34. The body contact region 40 is provided between the body region 34 and the first face P1. The body contact region 40 is provided adjacent to the source region 36, for example, in the second direction of the source region 36. The body contact region 40 and the source region 36 are arranged alternately in the second direction, for example.

The p-type impurity concentration in the body contact region 40 is higher than the p-type impurity concentration in the body region 34.

The body contact region 40 contains, for example, aluminum (Al) as a p-type impurity. The p-type impurity concentration in the body contact region 40 is, for example, equal to or more than $5\times10^{18}$ cm$^{-3}$ and equal to or less than $1\times10^{21}$ cm$^{-3}$.

The depth of the body contact region 40 is, for example, equal to or more than 0.3 μm and equal to or less than 0.6 μm.

The body contact region 40 is electrically connected to the source electrode 12. The electric potential of the body contact region 40 is fixed to the electric potential of the source electrode 12.

The silicide layer 28 is provided on the source region 36. The silicide layer 28 is provided on the body contact region 40.

The silicide layer 28 is provided between the source electrode 12 and the source region 36. The silicide layer 28 is provided between the source electrode 12 and the body contact region 40.

The silicide layer 28 is, for example, nickel silicide, titanium silicide, molybdenum silicide, or tungsten silicide.

The first gate electrode 20a is provided between the source electrode 12 and the silicon carbide layer 10. The first gate electrode 20a is provided on the first face P1 side of the silicon carbide layer 10. The first gate electrode 20a extends in a first direction.

The second gate electrode 20b is provided between the source electrode 12 and the silicon carbide layer 10. The second gate electrode 20b is provided on the first face P1 side of the silicon carbide layer 10. The second gate electrode 20b extends in the first direction. The second gate electrode 20b is adjacent to the first gate electrode 20a.

The third gate electrode 20c is provided between the source electrode 12 and the silicon carbide layer 10. The third gate electrode 20c is provided on the first face P1 side of the silicon carbide layer 10. The third gate electrode 20c extends in the first direction. The third gate electrode 20c is adjacent to the second gate electrode 20b.

The fourth gate electrode 20d is provided between the source electrode 12 and the silicon carbide layer 10. The fourth gate electrode 20d is provided on the first face P1 side of the silicon carbide layer 10. The fourth gate electrode 20d extends in the first direction. The fourth gate electrode 20d is adjacent to the first gate electrode 20a.

The fifth gate electrode 20e is provided between the source electrode 12 and the silicon carbide layer 10. The fifth gate electrode 20e is provided on the first face P1 side of the silicon carbide layer 10. The fifth gate electrode 20e extends in the first direction. The fifth gate electrode 20e is adjacent to the third gate electrode 20c.

The sixth gate electrode 20f is provided between the source electrode 12 and the silicon carbide layer 10. The sixth gate electrode 20f is provided on the first face P1 side of the silicon carbide layer 10. The sixth gate electrode 20f extends in the first direction. The sixth gate electrode 20f is adjacent to the fourth gate electrode 20d.

The gate electrode 20 is a conductive layer. The gate electrode 20 is, for example, polycrystalline silicon containing p-type impurities or n-type impurities.

The body region 34 facing the gate electrode 20 functions as a channel region of the MOSFET 100.

The gate wiring line 22 is provided between the source electrode 12 and the silicon carbide layer 10. The gate wiring line 22 is provided on the first face P1 side of the silicon carbide layer 10. A part of the gate wiring line 22 is provided between the source electrode 12 and the field insulating layer 27.

The gate wiring line 22 extends in a second direction crossing the first direction. The gate wiring line 22 extends, for example, in a second direction perpendicular to the first direction.

The gate electrode 20 is connected to the gate wiring line 22. For example, the first gate electrode 20a, the second gate electrode 20b, and the third gate electrode 20c are connected to the gate wiring line 22.

The gate wiring line 22 is a conductive layer. The gate wiring line 22 is, for example, polycrystalline silicon containing p-type impurities or n-type impurities.

The gate wiring line 22 is formed of, for example, the same material as the gate electrode 20.

The gate wiring line 22 is, for example, a polycrystalline layer continuous with the gate electrode 20. The gate wiring line 22 is, for example, a polycrystalline silicon layer continuous with the gate electrode 20.

The gate wiring line 22 and the gate electrode 20 are simultaneously formed, for example, by patterning the formed conductive film.

A connection portion between the gate electrode 20 and the gate wiring line 22 is provided between the source electrode 12 and the silicon carbide layer 10. For example, a connection portion between the first gate electrode 20a and the gate wiring line 22 and a connection portion between the second gate electrode 20b and the gate wiring line 22 are provided between the source electrode 12 and the silicon carbide layer 10.

As shown in FIG. 2, the distance between the first gate electrode 20a and the second gate electrode 20b in the second direction in a first region R1 is defined as S1. In addition, the distance between the first gate electrode 20a and the second gate electrode 20b in the second direction in a second region R2 closer to the gate wiring line 22 than the first region R1 is defined as S2.

In addition, as shown in FIG. 2, the distance between the second gate electrode 20b and the third gate electrode 20c in the second direction in the first region R1 is defined as S3. In addition, the distance between the second gate electrode 20b and the third gate electrode 20c in the second direction in the second region R2 is defined as S4.

The MOSFET 100 satisfies the following Expression 1, Expression 2, and Expression 3.

$$S1 < S3 \qquad \text{(Expression 1)}$$

$$S1 < S2 \qquad \text{(Expression 2)}$$

$$S3 > S4 \qquad \text{(Expression 3)}$$

In addition, the MOSFET 100 satisfies, for example, the following Expression 4.

$$S1 < S4 \qquad \text{(Expression 4)}$$

In addition, the MOSFET 100 satisfies, for example, the following Expression 5.

$$S2 < S3 \qquad \text{(Expression 5)}$$

In addition, the MOSFET 100 satisfies, for example, the following Expression 6.

$$0.8 \times S2 < S4 < 1.2 \times S2 \qquad \text{(Expression 6)}$$

In addition, the MOSFET 100 satisfies, for example, the following Expression 7.

$$2 \times S1 < S3 \qquad \text{(Expression 7)}$$

In addition, the MOSFET 100 satisfies, for example, the following Expression 8.

$$S1 + S3 = S2 + S4 \qquad \text{(Expression 8)}$$

The width of the gate electrode 20 in the second direction is, for example, equal to or more than 1 μm and equal to or less than 3 μm.

The distance S1 is, for example, equal to or more than 1 μm and equal to or less than 3 μm. The distance S2 is, for example, equal to or more than 1.5 μm and equal to or less than 5 μm. The distance S3 is, for example, equal to or more than 2 μm and equal to or less than 8 μm. The distance S4 is, for example, equal to or more than 1.5 μm and equal to or less than 5 μm.

The gate insulating layer 24 is provided between the gate electrode 20 and the silicon carbide layer 10. The gate insulating layer 24 is provided, for example, between the first gate electrode 20a and the silicon carbide layer 10. The gate insulating layer 24 is provided, for example, between the second gate electrode 20b and the silicon carbide layer 10.

The gate insulating layer 24 is provided between the gate electrode 20 and the body region 34. The gate insulating layer 24 is provided, for example, between the first gate electrode 20a and the body region 34. The gate insulating layer 24 is provided, for example, between the second gate electrode 20b and the body region 34.

The gate insulating layer 24 is, for example, silicon oxide. For example, a high-k insulating material (insulating material with a high dielectric constant) can be applied to the gate insulating layer 24. For example, silicon oxide subjected to nitriding treatment can be applied to the gate insulating layer 24.

The thickness of the gate insulating layer 24 is, for example, equal to or more than 20 nm and equal to or less than 100 nm.

The interlayer insulating layer 26 is provided, for example, between the gate electrode 20 and the source electrode 12. The interlayer insulating layer 26 is provided, for example, between the gate wiring line 22 and the source electrode 12. The interlayer insulating layer 26 is provided, for example, between the silicon carbide layer 10 and the source electrode 12.

The interlayer insulating layer 26 is provided, for example, between the source electrode 12 and the connection portion between the first gate electrode 20a and the gate wiring line 22. In addition, the interlayer insulating layer 26 is provided, for example, between the source electrode 12 and the connection portion between the second gate electrode 20b and the gate wiring line 22.

The interlayer insulating layer 26 has, for example, a function of electrically separating the first gate electrode 20a, the second gate electrode 20b, the third gate electrode 20c, the fourth gate electrode 20d, the fifth gate electrode 20e, the sixth gate electrode 20f, and the gate wiring line 22 from the source electrode 12. The interlayer insulating layer 26 has, for example, a function of electrically separating the silicon carbide layer 10 and the source electrode 12 from each other.

The interlayer insulating layer 26 contains, for example, silicon oxide. The interlayer insulating layer 26 is, for example, silicon oxide. The interlayer insulating layer 26 is, for example, a deposited film formed by a vapor phase growth method.

The thickness of the interlayer insulating layer 26 is, for example, equal to or more than 50 nm and equal to or less than 900 nm.

The interlayer insulating layer 26 has the contact hole 26a. The contact hole 26a is an opening provided in the interlayer insulating layer 26.

The field insulating layer 27 is provided between a part of the gate wiring line 22 and the silicon carbide layer 10. The field insulating layer 27 has, for example, a function of electrically separating the gate wiring line 22 and the silicon carbide layer 10 from each other.

The field insulating layer 27 contains, for example, silicon oxide. The field insulating layer 27 is, for example, silicon oxide. The field insulating layer 27 is, for example, a deposited film formed by a vapor phase growth method.

The silicide layer 28 is provided between the source electrode 12 and the silicon carbide layer 10. The silicide layer 28 is provided, for example, between the source electrode 12 and the source region 36. The silicide layer 28 is provided, for example, between the source electrode 12 and the body contact region 40. The silicide layer 28 is, for example, nickel silicide.

The silicide layer 28 has a function of reducing the electrical resistance between the source electrode 12 and the source region 36. The silicide layer 28 has a function of reducing the electrical resistance between the source electrode 12 and the body contact region 40.

The source electrode 12 is provided on the first face P1 side of the silicon carbide layer 10. The source electrode 12 contains a metal.

The source electrode 12 has, for example, a stacked structure of a barrier metal layer and a main metal layer. For example, the barrier metal layer is in contact with the silicon carbide layer 10.

The barrier metal layer contains, for example, titanium (Ti). The barrier metal layer is, for example, titanium or titanium nitride.

The main metal layer contains, for example, aluminum (Al). The main metal layer is, for example, aluminum or an aluminum alloy.

For example, a source voltage is applied to the source electrode 12. The source voltage is, for example, 0 V.

The source electrode 12 has the first portion 12a and the second portion 12b.

The first portion 12a is disposed, for example, between the first gate electrode 20a and the second gate electrode 20b. The first portion 12a is disposed, for example, between the third gate electrode 20c and the fifth gate electrode 20e. The first portion 12a is in contact with the silicide layer 28.

The second portion 12b is disposed, for example, between the second gate electrode 20b and the third gate electrode 20c. The second portion 12b is in contact with the drift region 32. The second portion 12b is in contact with the drift region 32, for example, on the first face P1. The junction between the second portion 12b and the drift region 32 is a Schottky junction.

In the MOSFET 100, the second portion 12b of the source electrode 12, the drift region 32, the drain region 30, and the drain electrode 14 form an SBD. The second portion 12b serves as an anode of the SBD, and the drain electrode 14 serves as a cathode of the SBD.

The metal wiring line 18 is provided on the first face P1 side of the silicon carbide layer 10. The metal wiring line 18 contains a metal.

As shown in FIG. 1, the metal wiring line 18 extends, for example, in the second direction. The metal wiring line 18 is electrically connected to the gate electrode pad 16.

The metal wiring line 18 is separated from the source electrode 12. The metal wiring line 18 is electrically separated from the source electrode 12.

The metal wiring line 18 has, for example, a stacked structure of a barrier metal layer and a main metal layer. The barrier metal layer contains, for example, titanium (Ti). The barrier metal layer is, for example, titanium or titanium nitride. The main metal layer contains, for example, aluminum (Al). The main metal layer is, for example, aluminum or an aluminum alloy.

The metal wiring line 18 is formed of, for example, the same material as the source electrode 12.

The metal wiring line 18 and the source electrode 12 are simultaneously formed, for example, by patterning the formed conductive film. The metal wiring line 18 and the source electrode 12 are separated from each other by patterning.

The metal wiring line 18 is electrically connected to the gate wiring line 22. As shown in FIG. 5, the metal wiring line 18 is electrically connected to the gate wiring line 22 through the contact hole 26a. The metal wiring line 18 is in contact with, for example, the gate wiring line 22.

The drain electrode 14 is provided on the second face P2 side of the silicon carbide layer 10. The drain electrode 14 is in contact with the drain region 30.

The drain electrode 14 is, for example, a metal or a metal semiconductor compound. The drain electrode 14 contains at least one material selected from a group consisting of nickel silicide, titanium (Ti), nickel (Ni), silver (Ag), and gold (Au), for example.

For example, a drain voltage is applied to the drain electrode 14. The drain voltage is, for example, equal to or more than 500 V and equal to or less than 6000 V.

The gate electrode pad 16 is provided on the first face P1 side of the silicon carbide layer 10. The gate electrode pad 16 is electrically connected to the metal wiring line 18.

The gate electrode pad 16 is formed of, for example, the same material as the metal wiring line 18 and the source electrode 12.

The gate electrode pad 16, the metal wiring line 18, and the source electrode 12 are simultaneously formed, for example, by patterning the formed conductive film. The gate electrode pad 16 is separated from the source electrode 12 by patterning, for example.

A gate voltage for driving the MOSFET 100 is applied to the gate electrode pad 16. The gate voltage is, for example, equal to or more than 0 V and equal to or less than 30 V.

A gate voltage is applied from the gate electrode pad 16 to the gate electrode 20 through the metal wiring line 18 and the gate wiring line 22.

Next, the function and effect of the MOSFET 100 of the first embodiment will be described.

Figure 6:
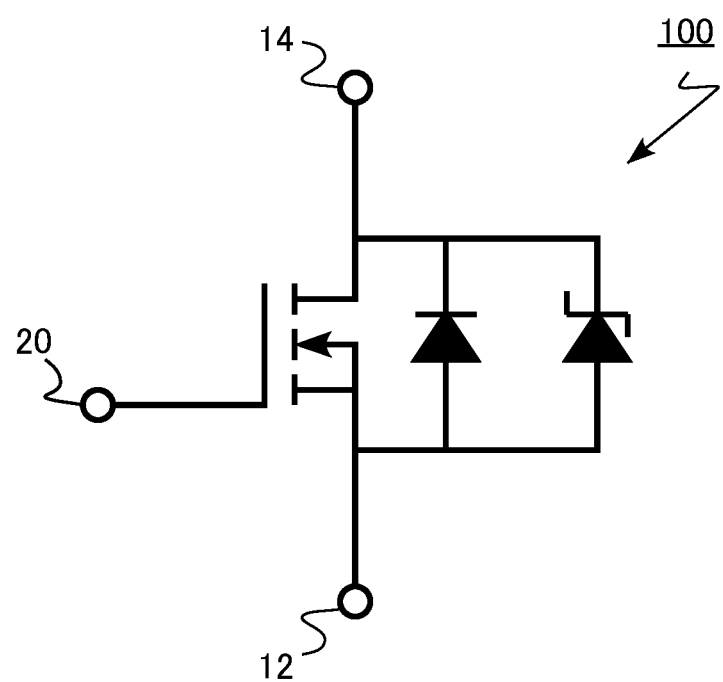
FIG. 6 is an equivalent circuit diagram of the semiconductor device of the first embodiment.

FIG. 6 is an equivalent circuit diagram of the semiconductor device of the first embodiment. Between the source electrode 12 and the drain electrode 14, a pn diode and an SBD are connected as built-in diodes in parallel with a transistor having the gate electrode 20. The body region 34 is the anode of the pn junction diode, and the drift region 32 is the cathode of the pn junction diode. In addition, the second portion 12b of the source electrode 12 is the anode of the SBD, and the drift region 32 is the cathode of the SBD.

Hereinafter, in a MOSFET having a built-in SBD, a region where a transistor having a gate electrode is arranged is referred to as a transistor region, and a region where an SBD is arranged is referred to as a Schottky region.

In the MOSFET 100, one Schottky region is provided for every three gate electrodes 20.

For example, a case where the MOSFET 100 is used as a switching element connected to an inductive load is considered. When the MOSFET 100 is turned off, a voltage that is positive with respect to the drain electrode 14 may be applied to the source electrode 12 due to the load current caused by the inductive load. In this case, a forward current flows through the built-in diode. This state is also referred to as a reverse conduction state.

A forward voltage (Vf) at which a forward current starts to flow through the SBD is lower than a forward voltage (Vf) of the pn junction diode. Therefore, first, a forward current flows through the SBD.

The forward voltage (Vf) of the SBD is, for example, 1.0 V. The forward voltage (Vf) of the pn junction diode is, for example, 2.5 V.

The SBD operates in a unipolar manner. Therefore, even if a forward current flows, no stacking fault grows in the silicon carbide layer 10 due to the recombination energy of the carriers.

In the MOSFET 100, the growth of a stacking fault in the silicon carbide layer 10 is suppressed by providing a built-in SBD. Therefore, the reliability of the MOSFET 100 is improved.

In the MOSFET 100, since a built-in SBD is provided, the distance between the gate electrode 20 and the gate electrode 20 in the Schottky region is larger than the distance between the gate electrode 20 and the gate electrode 20 in the transistor region. Specifically, in order to increase the contact area between the second portion 12b of the source electrode 12 and the drift region 32 having a Schottky junction therebetween, the distance between the gate electrode 20 and the gate electrode 20 in the Schottky region is increased.

The distance S3 between the second gate electrode 20b and the third gate electrode 20c in the first region R1 is made larger than the distance S1 between the first gate electrode 20a and the second gate electrode 20b in the first region R1. That is, the following Expression 1 is satisfied.

$$S1<S3 \qquad \text{(Expression 1)}$$

Figure 7:
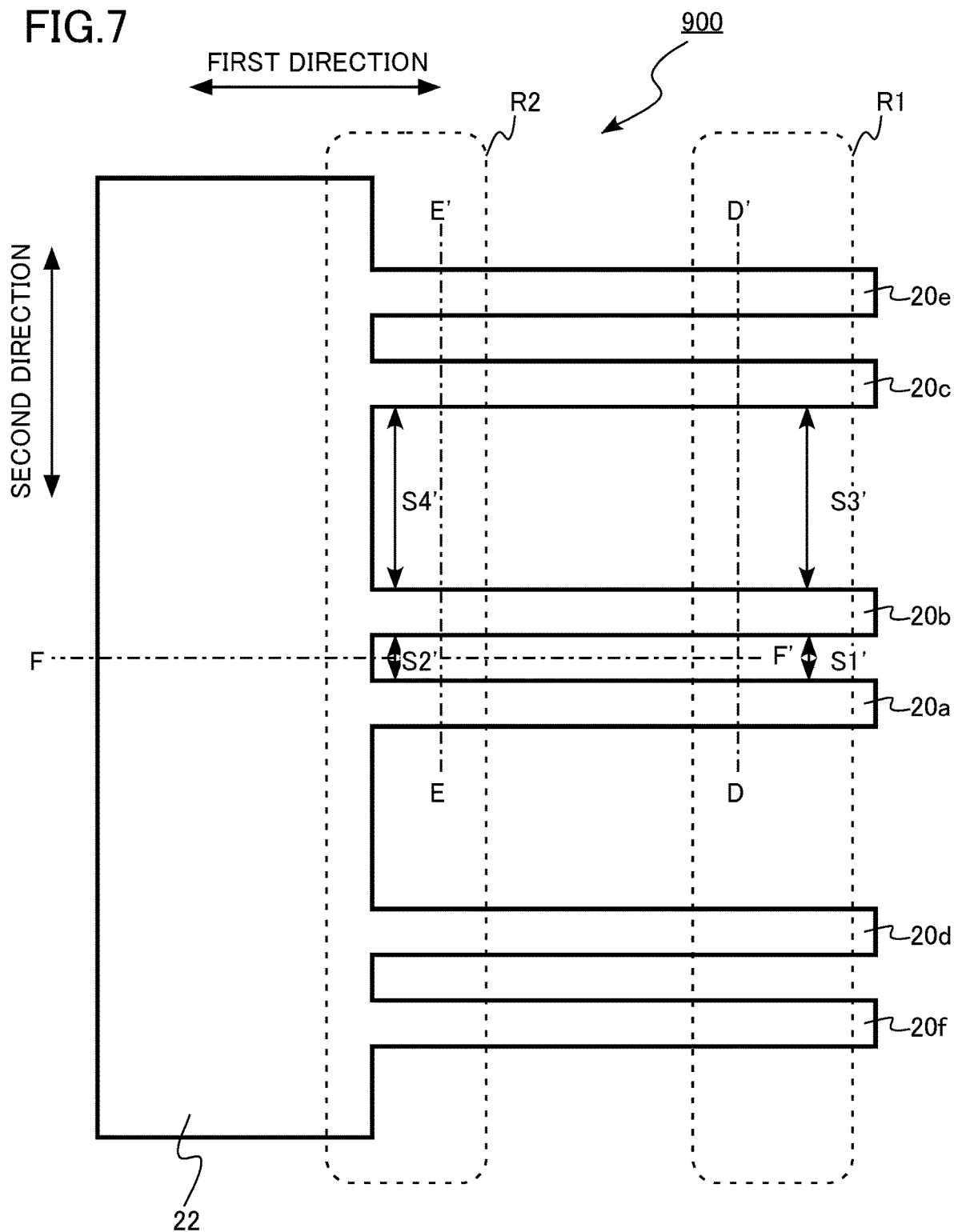
FIG. 7 is an enlarged schematic top view of a comparative example of the semiconductor device of the first embodiment.

FIG. 7 is an enlarged schematic top view of a comparative example of the semiconductor device of the first embodiment. FIG. 7 shows a pattern layout of a gate electrode and a gate wiring line. FIG. 7 is a diagram corresponding to FIG. 2.

Figure 8:
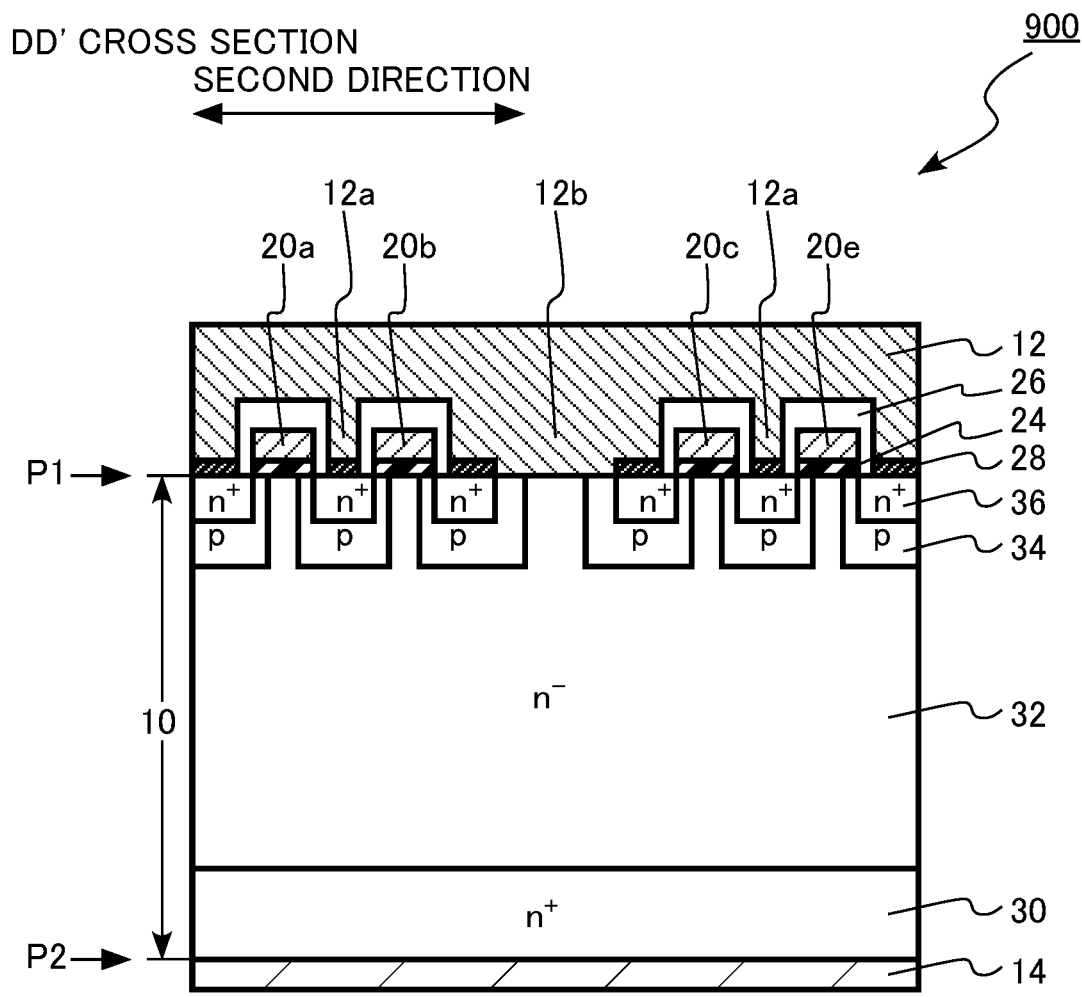
FIG. 8 is an enlarged schematic cross-sectional view of a comparative example of the semiconductor device of the first embodiment.
Figure 9:
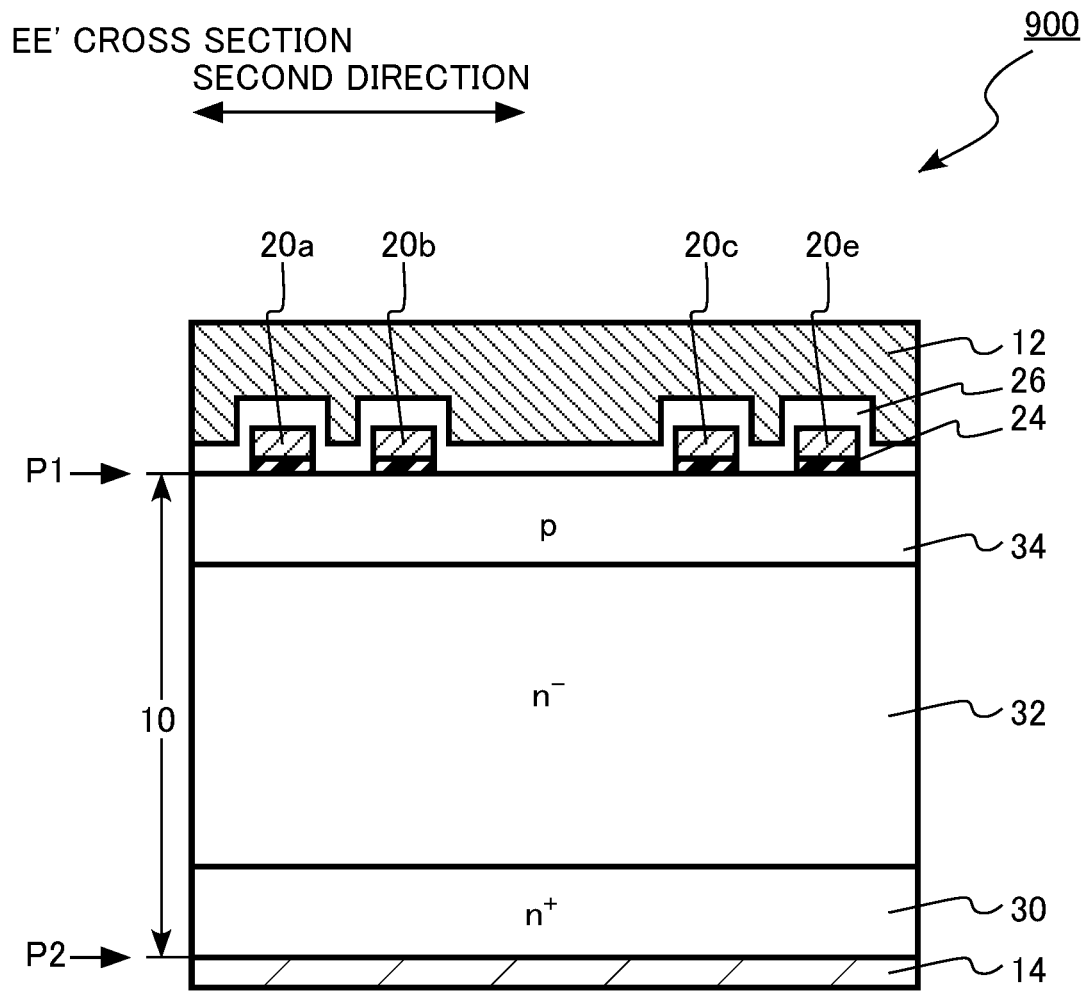
FIG. 9 is an enlarged schematic cross-sectional view of a comparative example of the semiconductor device of the first embodiment.
Figure 10:
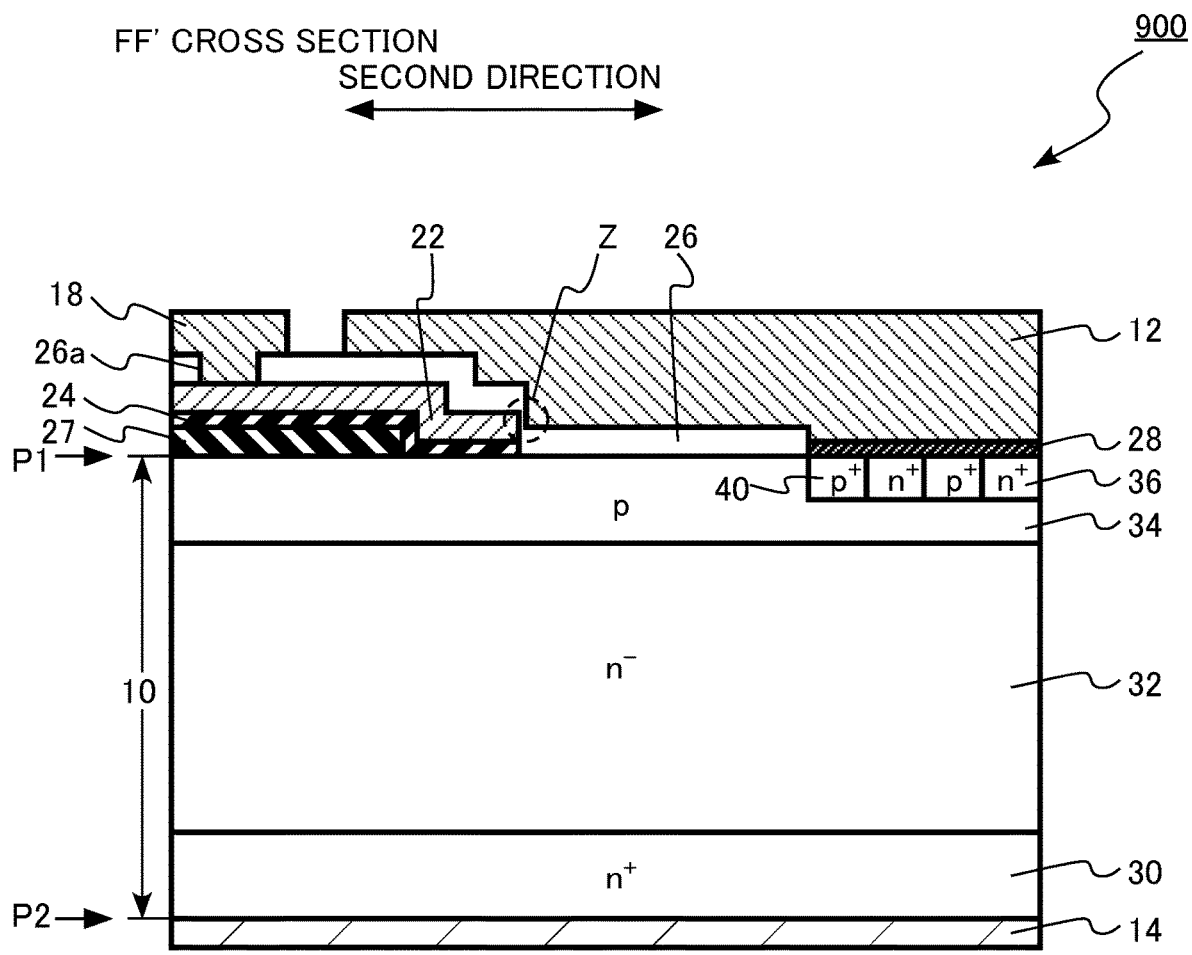
FIG. 10 is an enlarged schematic cross-sectional view of a comparative example of the semiconductor device of the first embodiment.

FIGS. 8, 9, and 10 are enlarged schematic cross-sectional views of the comparative example of the semiconductor device of the first embodiment. FIG. 8 is a cross-sectional view taken along the line DD' of FIG. 7. FIG. 9 is a cross-sectional view taken along the line EE' of FIG. 7. FIG. 10 is a cross-sectional view taken along the line FF' of FIG. 7. FIGS. 8, 9, and 10 are cross sections corresponding to FIGS. 3, 4, and 5, respectively.

Similar to the MOSFET 100, a MOSFET 900 of the comparative example of the first embodiment includes an SBD as a built-in diode. The MOSFET 900 is different from the MOSFET 100 in that the distance between the gate electrode 20 and the gate electrode 20 in the first region R1 is equal to the distance between the gate electrode 20 and the gate electrode 20 in the second region R2.

Specifically, as shown in FIG. 7, the distance between the first gate electrode 20a and the second gate electrode 20b in the second direction in the first region R1 is defined as S1'. In addition, the distance between the first gate electrode 20a and the second gate electrode 20b in the second direction in a second region R2 closer to the gate wiring line 22 than the first region R1 is defined as S2'.

In addition, as shown in FIG. 7, the distance between the second gate electrode 20b and the third gate electrode 20c in the second direction in the first region R1 is defined as S3'. In addition, the distance between the second gate electrode 20b and the third gate electrode 20c in the second direction in the second region R2 is defined as S4'.

In the MOSFET 900, the distance S1' and the distance S2' are equal. In addition, in the MOSFET 900, the distance S3' and the distance S4' are equal.

Therefore, the MOSFET 900 has a smaller distance S2' than the distance S4'.

In the MOSFET 900, as shown in FIG. 10, the thickness of the interlayer insulating layer 26 in a region Z may be reduced. The region Z is in the vicinity of the connection portion between the first gate electrode 20a and the gate wiring line 22 and the connection portion between the second gate electrode 20b and the gate wiring line 22. The region Z is a region between the connection portion between the first gate electrode 20a and the gate wiring line 22 and the connection portion between the second gate electrode 20b and the gate wiring line 22.

As the thickness of the interlayer insulating layer 26 in the region Z decreases, the leakage current between the gate wiring line 22 and the source electrode 12 increases, so that the gate wiring line 22 and the source electrode 12 may be short-circuited.

Conceivably, the reason why the thickness of the interlayer insulating layer 26 in the region Z is reduced is that, for example, when the interlayer insulating layer 26 is deposited by the vapor phase growth method, the step coverage of the interlayer insulating layer 26 in the region Z surrounded by the gate electrode 20 and the gate wiring line 22 having a small distance therebetween is deteriorated. In addition, conceivably, this is because, for example, the etching amount at the time of wet etching applied to the surface of the interlayer insulating layer 26 before the source electrode 12 is formed after the interlayer insulating layer 26 is formed increases in the region Z surrounded by the gate electrode 20 and the gate wiring line 22 having a small distance therebetween.

It is considered that the thickness of the interlayer insulating layer 26 in the region Z becomes even smaller as the distance between the gate electrodes 20 becomes smaller. Therefore, it is expected that a short circuit between the gate wiring line 22 and the source electrode 12 will become more apparent due to the scaling-down of the MOSFET and this will be an obstacle to the scaling-down of the MOSFET.

In the MOSFET 100 of the first embodiment, as shown in FIG. 2, the distance S2 between the first gate electrode 20a and the second gate electrode 20b in the second region R2 is made larger than the distance S1 between the first gate electrode 20a and the second gate electrode 20b in the first region R1. That is, the following Expression 2 is satisfied.

$$S1<S2 \qquad \text{(Expression 2)}$$

Therefore, in the vicinity of the connection portion between the first gate electrode 20a and the gate wiring line 22 and the connection portion between the second gate electrode 20b and the gate wiring line 22, the distance S2 between the first gate electrode 20a and the second gate electrode 20b increases.

Figure 11:
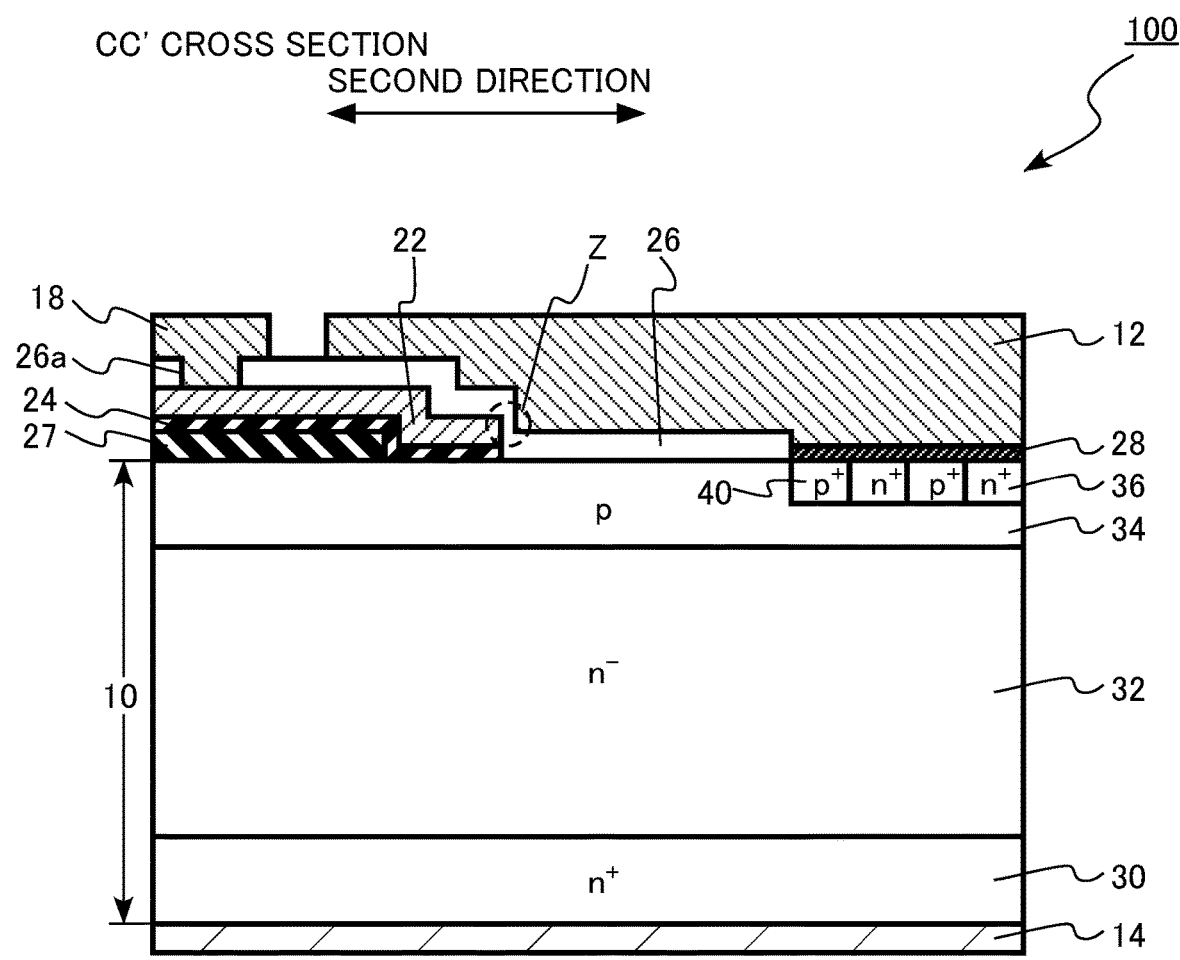
FIG. 11 is an explanatory diagram of the function and effect of the semiconductor device of the first embodiment.

FIG. 11 is an explanatory diagram of the function and effect of the semiconductor device of the first embodiment. FIG. 11 is a diagram corresponding to FIGS. 5 and 11.

As shown in FIG. 11, the thickness of the interlayer insulating layer 26 in the region Z of the MOSFET 100 is larger than that in the MOSFET 900 of the comparative example. Conceivably, this is because, for example, the step coverage of the interlayer insulating layer 26 in the region Z is improved by making the distance S2 between the first gate electrode 20a and the second gate electrode 20b larger than the distance S2'. In addition, conceivably, this is because, for example, the etching amount of the region Z at the time of wet etching applied to the surface of the interlayer insulating layer 26 before the source electrode 12 is formed after the interlayer insulating layer 26 is formed decreases since the distance S2 between the first gate electrode 20a and the second gate electrode 20b is larger than the distance S2'.

Therefore, according to the MOSFET 100 of the first embodiment, a short circuit between the gate wiring line 22 and the source electrode 12 is suppressed. As a result, the MOSFET 100 that can be scaled down can be realized.

From the viewpoint of ensuring a predetermined magnitude for the distance S4 and suppressing a short circuit between the gate wiring line 22 and the source electrode 12, it is preferable that the MOSFET 100 satisfies the following Expression 4 and Expression 5.

$$S1<S4 \quad \text{(Expression 4)}$$

$$S2<S3 \quad \text{(Expression 5)}$$

From the viewpoint of suppressing a short circuit between the gate wiring line 22 and the source electrode 12, it is preferable that the distance S2 and the distance S4 are equal.

In addition, from the viewpoint of suppressing a short circuit between the gate wiring line 22 and the source electrode 12, it is preferable that the difference between the distance S2 and the distance S4 is small. Therefore, it is preferable that the MOSFET 100 satisfies the following Expression 6.

$$0.8 \times S2 < S4 < 1.2 \times S2 \quad \text{(Expression 6)}$$

From the viewpoint of ensuring the sufficient magnitude of the Schottky region and increasing the on-current of the SBD, it is preferable that the MOSFET 100 satisfies the following Expression 7. That is, it is preferable that the distance S3 is larger than twice the distance S1.

$$2 \times S1 < S3 \quad \text{(Expression 7)}$$

Figure 12:
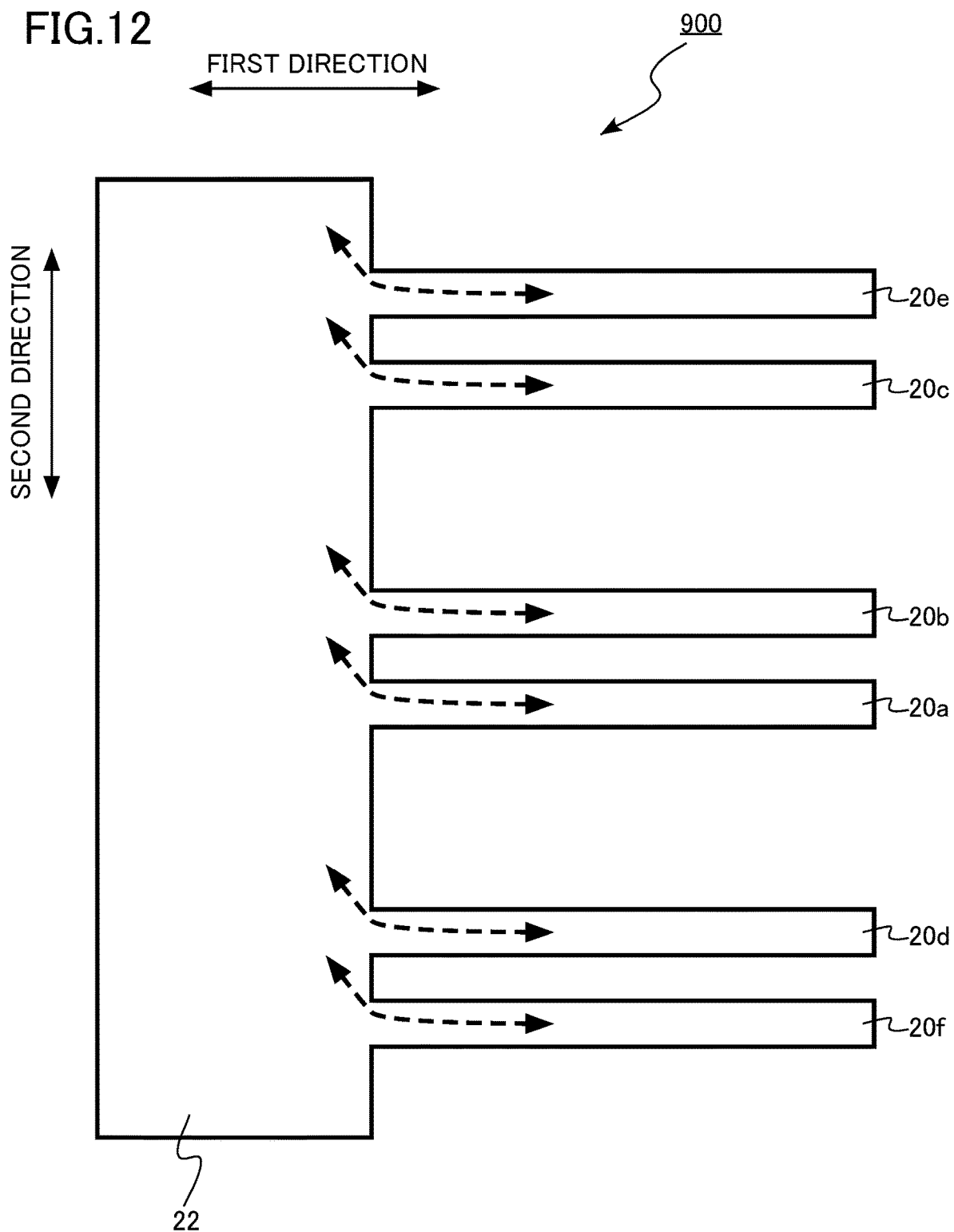
FIG. 12 is an explanatory diagram of the function and effect of the semiconductor device of the first embodiment.
Figure 13:
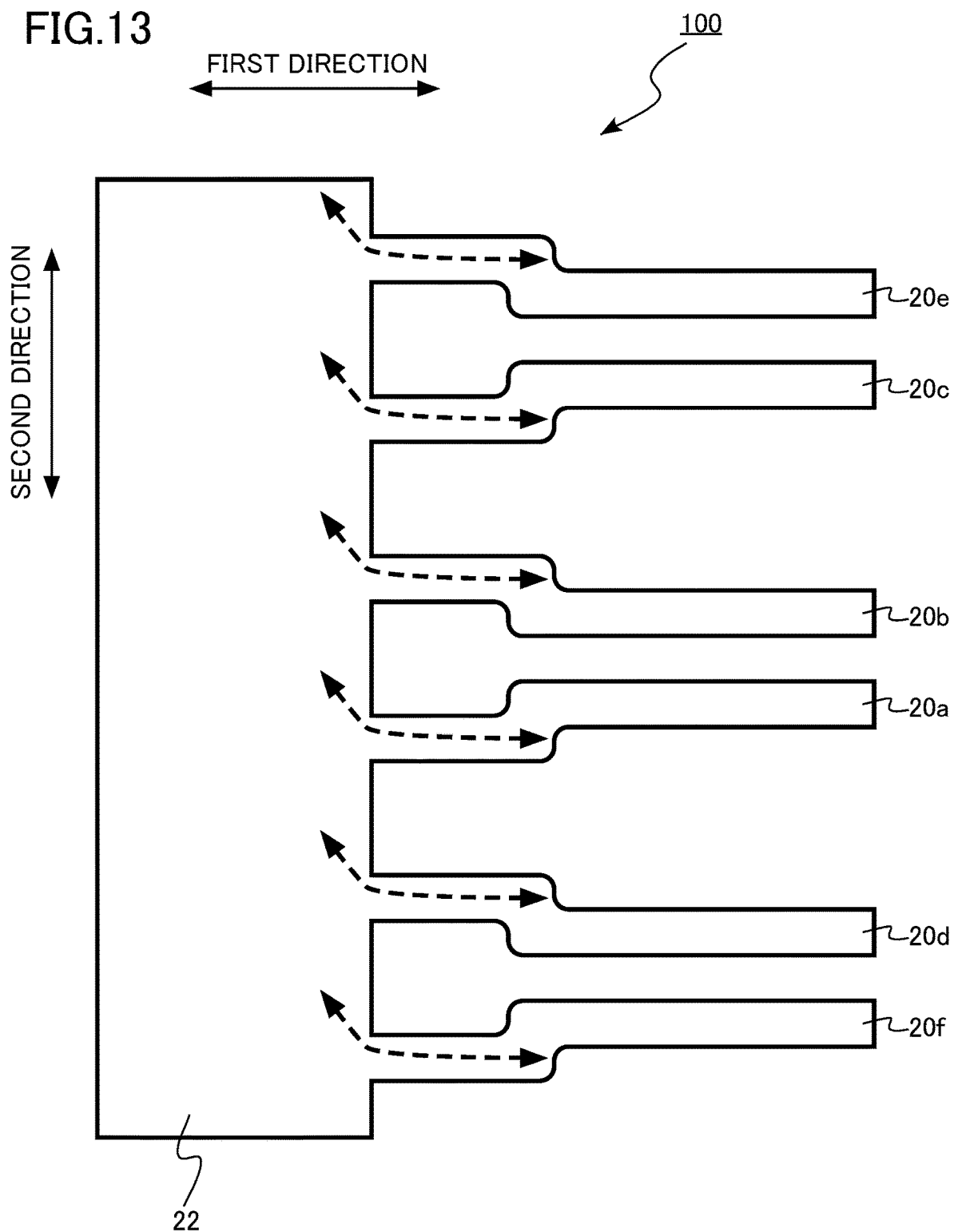
FIG. 13 is an explanatory diagram of the function and effect of the semiconductor device of the first embodiment.

FIGS. 12 and 13 are explanatory diagrams of the function and effect of the semiconductor device of the first embodiment. FIG. 12 is an enlarged schematic top view of the MOSFET 900 of the comparative example of the first embodiment. FIG. 13 is an enlarged schematic top view of the MOSFET 100 of the first embodiment. FIGS. 12 and 13 show a pattern layout of the gate electrode 20 and the gate wiring line 22.

In FIGS. 12 and 13, a current path when charging and discharging the gate electrode 20 is schematically shown by a dotted line. As shown in FIGS. 12 and 13, the current path for charging and discharging the gate electrode 20 is concentrated at, for example, the corner of the connection portion between the gate electrode 20 and the gate wiring line 22. Therefore, the amount of heat generated at the corner of the connection portion between the gate electrode 20 and the gate wiring line 22 increases.

In particular, as shown in FIG. 12, in the case of the MOSFET 900 of the comparative example, there is a portion where the connection portions of the adjacent gate electrodes 20 with respect to the gate wiring line 22 are close to each other. Specifically, for example, the connection portion of the first gate electrode 20a and the connection portion of the second gate electrode 20b are closer to each other than the connection portion of the second gate electrode 20b and the connection portion of the third gate electrode 20c are.

Therefore, in the portion where the connection portions of the adjacent gate electrodes 20 are close to each other, the amount of heat generated when charging and discharging the gate electrode 20 is larger than in the other portions. In other words, the distribution of the amount of heat generated is not uniform, and the amount of heat generated increases partially.

When the amount of heat generated increases, for example, a problem that the operation of the MOSFET 900 becomes unstable or the reliability of the gate insulating layer 24 decreases may occur.

As shown in FIG. 13, in the MOSFET 100 of the first embodiment, the connection portions of the adjacent gate electrodes 20 are distributed at predetermined intervals. For example, the connection portions of the adjacent gate electrodes 20 are distributed at equal intervals. Therefore, the uneven distribution of the amount of heat generated when charging and discharging the gate electrode 20 is suppressed. For example, the distribution of the amount of heat generated when charging and discharging the gate electrode 20 becomes uniform.

Therefore, for example, a problem that the operation of the MOSFET 100 becomes unstable or the reliability of the gate insulating layer 24 decreases is less likely to occur. As a result, the MOSFET 100 having stable characteristics and improved reliability is realized.

As described above, according to the first embodiment, a MOSFET that can be scaled down is realized. In addition, since characteristic fluctuations are suppressed, a MOSFET with improved reliability is realized.

Second Embodiment

A semiconductor device of a second embodiment is different from the semiconductor device of the first embodiment in that a fourth gate electrode provided between the first electrode and the silicon carbide layer and extending in the first direction is further provided, the first gate electrode being interposed between the second gate electrode and the fourth gate electrode, and assuming that the distance between the fourth gate electrode and the first gate electrode in the second direction in the first region is S5 and the distance between the fourth gate electrode and the first gate electrode in the second direction in the second region is S6, the following Expression 9 and Expression 10 are satisfied. Hereinafter, the description of a part of the content overlapping the first embodiment may be omitted.

$$S5<S3 \quad \text{(Expression 9)}$$

$$S5<S6 \quad \text{(Expression 10)}$$

Figure 14:
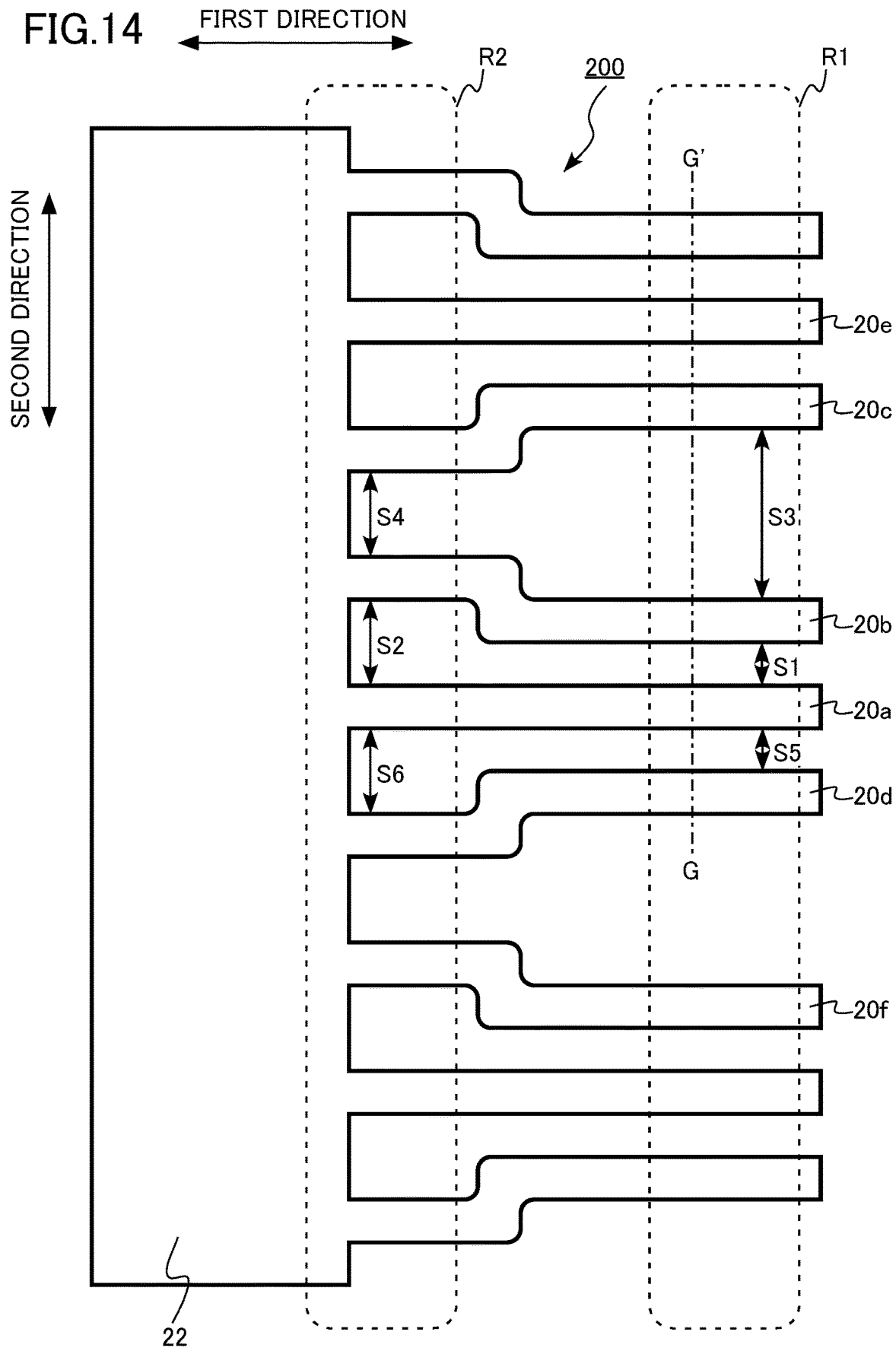
FIG. 14 is an enlarged schematic top view of a semiconductor device of a second embodiment.

FIG. 14 is an enlarged schematic top view of the semiconductor device of the second embodiment. FIG. 14 shows a pattern layout of a gate electrode and a gate wiring line. FIG. 14 is a diagram corresponding to FIG. 2 of the first embodiment.

Figure 15:
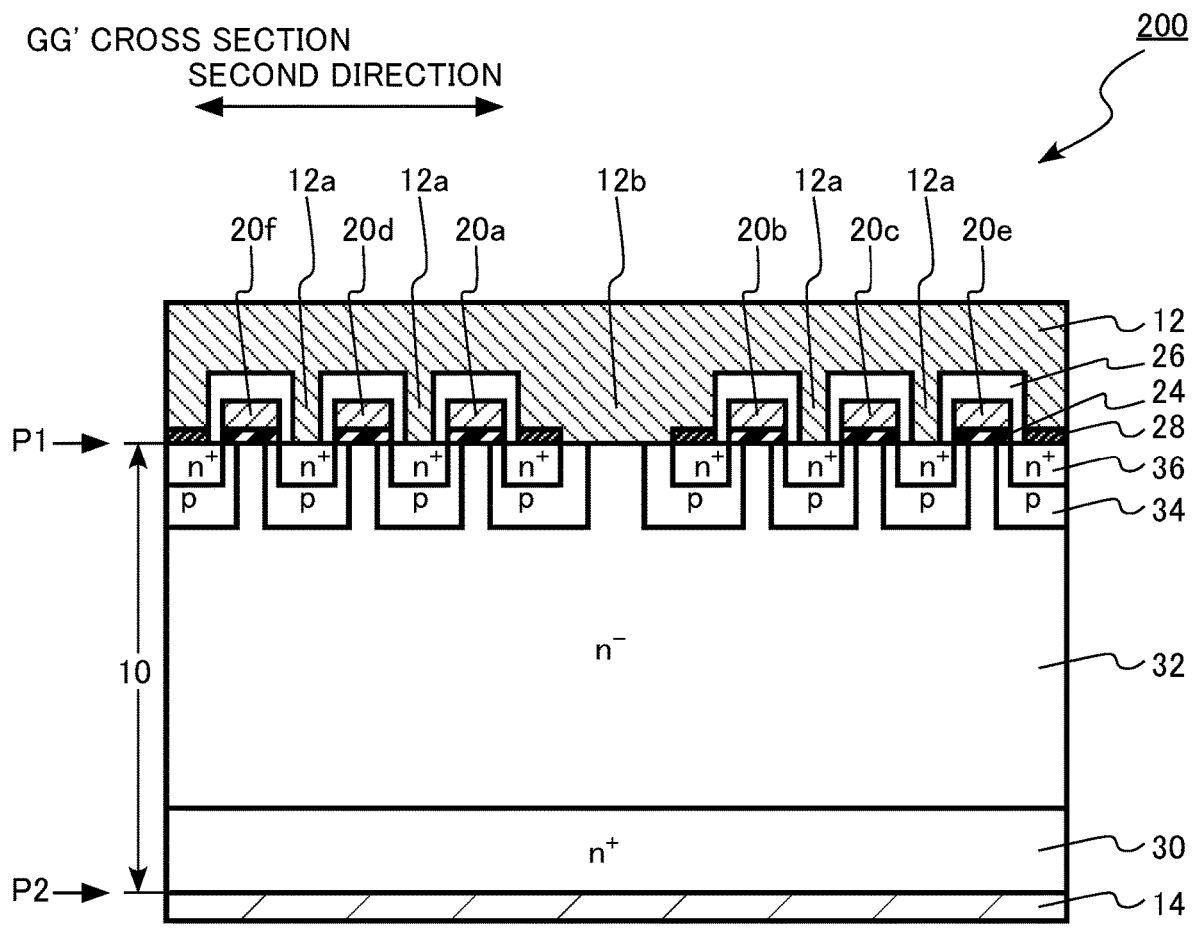
FIG. 15 is an enlarged schematic cross-sectional view of a comparative example of the semiconductor device of the second embodiment.

FIG. 15 is an enlarged schematic cross-sectional view of a comparative example of the semiconductor device of the second embodiment. FIG. 15 is a cross-sectional view taken along the line GG' of FIG. 14. FIG. 15 is a cross section corresponding to FIG. 3 of the first embodiment.

The semiconductor device of the second embodiment is a planar gate type vertical MOSFET 200 using silicon carbide. The MOSFET 200 is, for example, a DIMOSFET. In addition, the MOSFET 200 includes an SBD as a built-in diode.

The MOSFET 200 includes a silicon carbide layer 10, a source electrode 12 (first electrode), a drain electrode 14 (second electrode), a gate electrode pad 16, a metal wiring line 18, a first gate electrode 20a, a second gate electrode 20b, a third gate electrode 20c, a fourth gate electrode 20d, a fifth gate electrode 20e, a sixth gate electrode 20f, a gate wiring line 22, a gate insulating layer 24, an interlayer insulating layer 26, a field insulating layer 27, and a silicide layer 28. The source electrode 12 has a first portion 12a and a second portion 12b. The interlayer insulating layer 26 has a contact hole 26a. Hereinafter, the first gate electrode 20a, the second gate electrode 20b, the third gate electrode 20c, the fourth gate electrode 20d, the fifth gate electrode 20e, and the sixth gate electrode 20f may be simply referred to collectively as a gate electrode 20.

As shown in FIG. 14, the distance between the first gate electrode 20a and the second gate electrode 20b in the second direction in a first region R1 is defined as S1. In addition, the distance between the first gate electrode 20a and the second gate electrode 20b in the second direction in a second region R2 closer to the gate wiring line 22 than the first region R1 is defined as S2.

In addition, as shown in FIG. 14, the distance between the second gate electrode 20b and the third gate electrode 20c in the second direction in the first region R1 is defined as S3. In addition, the distance between the second gate electrode 20b and the third gate electrode 20c in the second direction in the second region R2 is defined as S4.

In addition, as shown in FIG. 14, the distance between the fourth gate electrode 20d and the first gate electrode 20a in the second direction in the first region R1 is defined as S5. In addition, the distance between the fourth gate electrode 20d and the first gate electrode 20a in the second direction in the second region R2 is defined as S6.

The MOSFET 200 satisfies the following Expression 1, Expression 2, Expression 3, Expression 9, and Expression 10.

$$S1<S3 \quad \text{(Expression 1)}$$

$$S1<S2 \quad \text{(Expression 2)}$$

$$S3>S4 \quad \text{(Expression 3)}$$

$$S5<S3 \quad \text{(Expression 9)}$$

$$S5<S6 \quad \text{(Expression 10)}$$

The MOSFET 200 satisfies, for example, the following Expression 11.

$$S1+S3+S5=S2+S4+S6 \quad \text{(Expression 11)}$$

According to the MOSFET 200 of the second embodiment, a short circuit between the gate wiring line 22 and the source electrode 12 is suppressed as in the first embodiment. Therefore, the MOSFET 200 that can be scaled down can be realized.

According to the MOSFET 200 of the second embodiment, as in the first embodiment, a problem such as unstable operation or reduced reliability of the gate insulating layer 24 is less likely to occur. Therefore, the MOSFET 200 having stable characteristics and improved reliability is realized.

In the MOSFET 200, one Schottky region is provided for every four gate electrodes 20. Therefore, the occupancy ratio of the transistor region to the Schottky region is larger than that in the MOSFET 100 of the first embodiment in which one Schottky region is provided for every three gate electrodes 20. For this reason, the on-current of the transistor is larger than that in the MOSFET 100.

As described above, according to the second embodiment, a MOSFET that can be scaled down is realized. In addition, since characteristic fluctuations are suppressed, a MOSFET with improved reliability is realized.

Third Embodiment

A semiconductor device of a third embodiment is different from the semiconductor device of the first embodiment in that the first electrode does not include the second portion in contact with the first silicon carbide region. Hereinafter, the description of a part of the content overlapping the first embodiment may be omitted.

Figure 16:
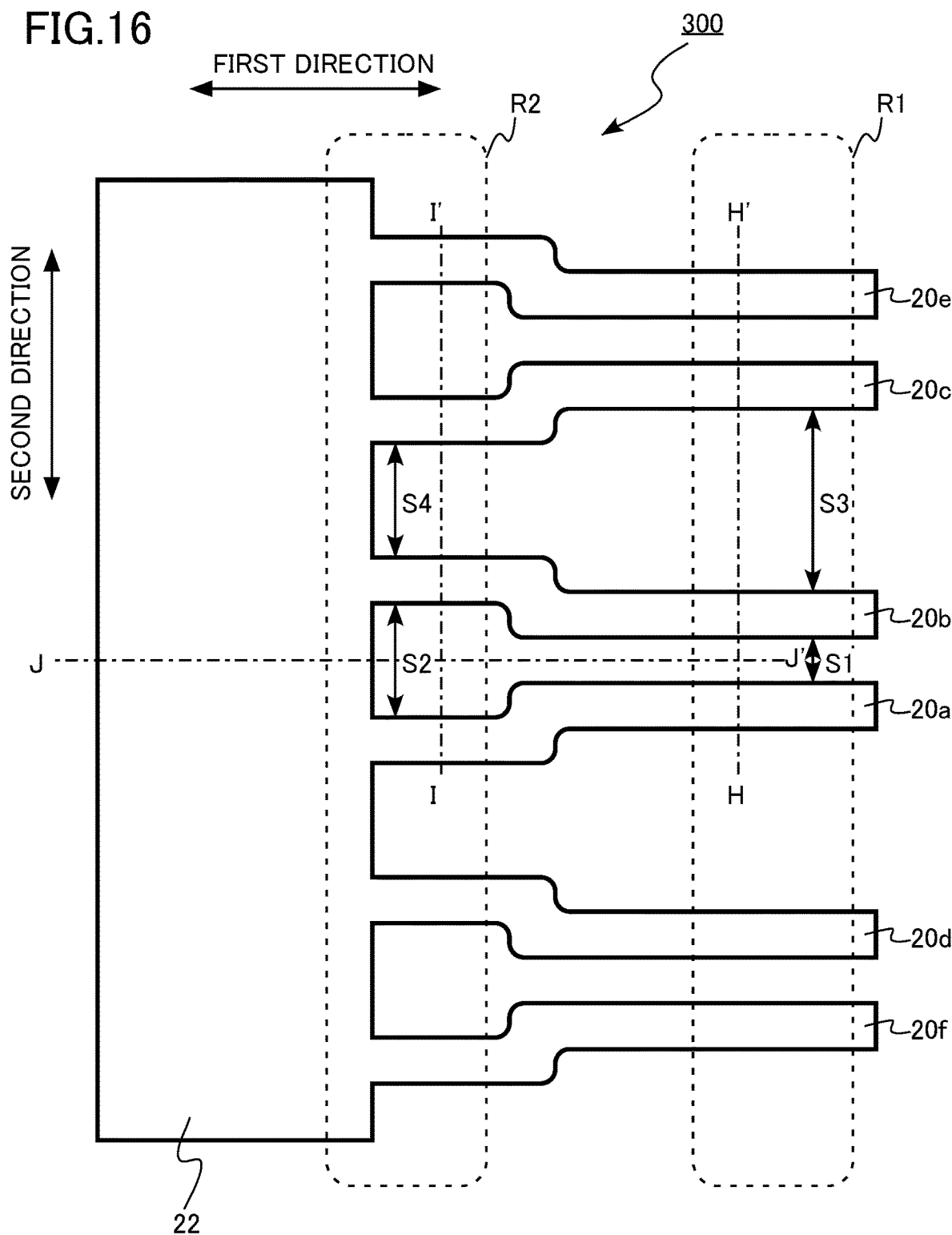
FIG. 16 is an enlarged schematic top view of a semiconductor device of a third embodiment.

FIG. 16 is an enlarged schematic top view of the semiconductor device of the third embodiment. FIG. 16 shows a pattern layout of a gate electrode and a gate wiring line.

Figure 17:
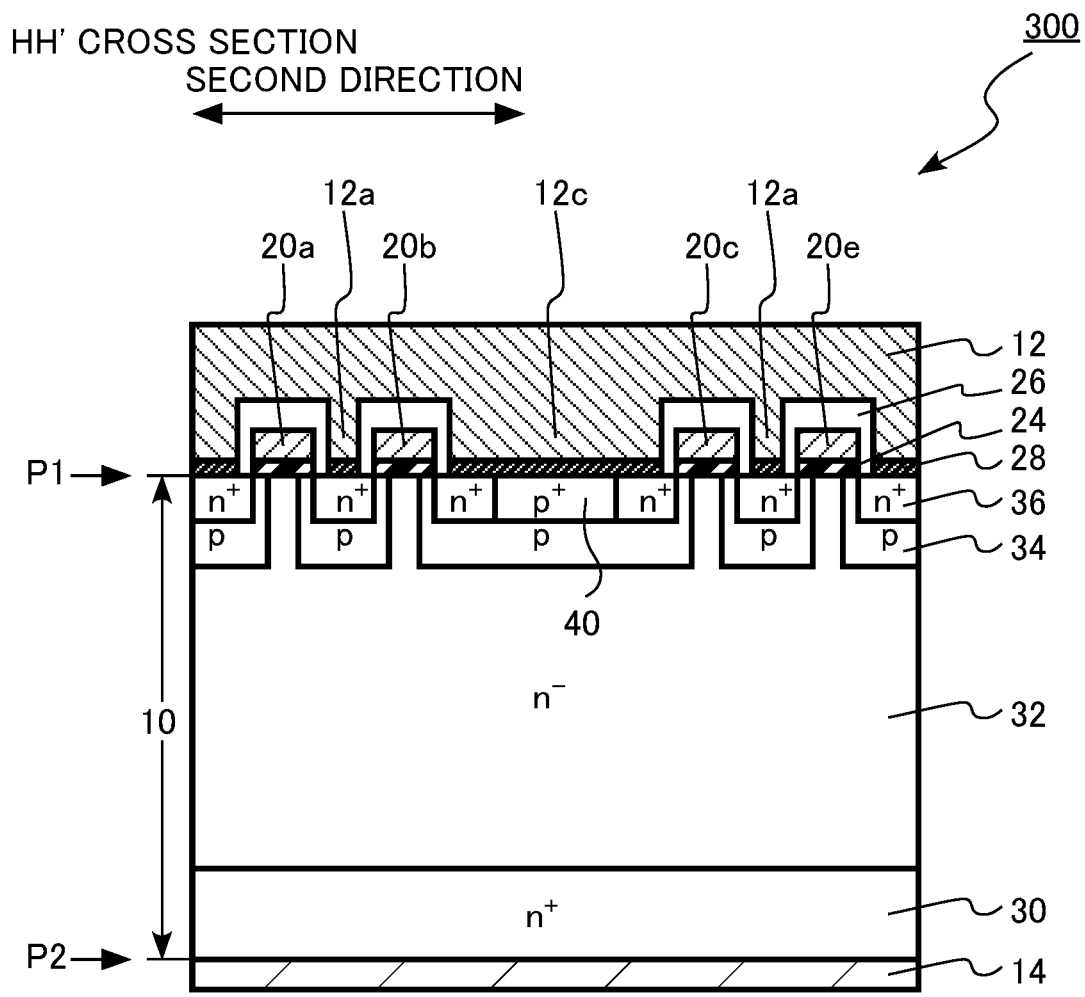
FIG. 17 is an enlarged schematic cross-sectional view of the semiconductor device of the third embodiment.
Figure 18:
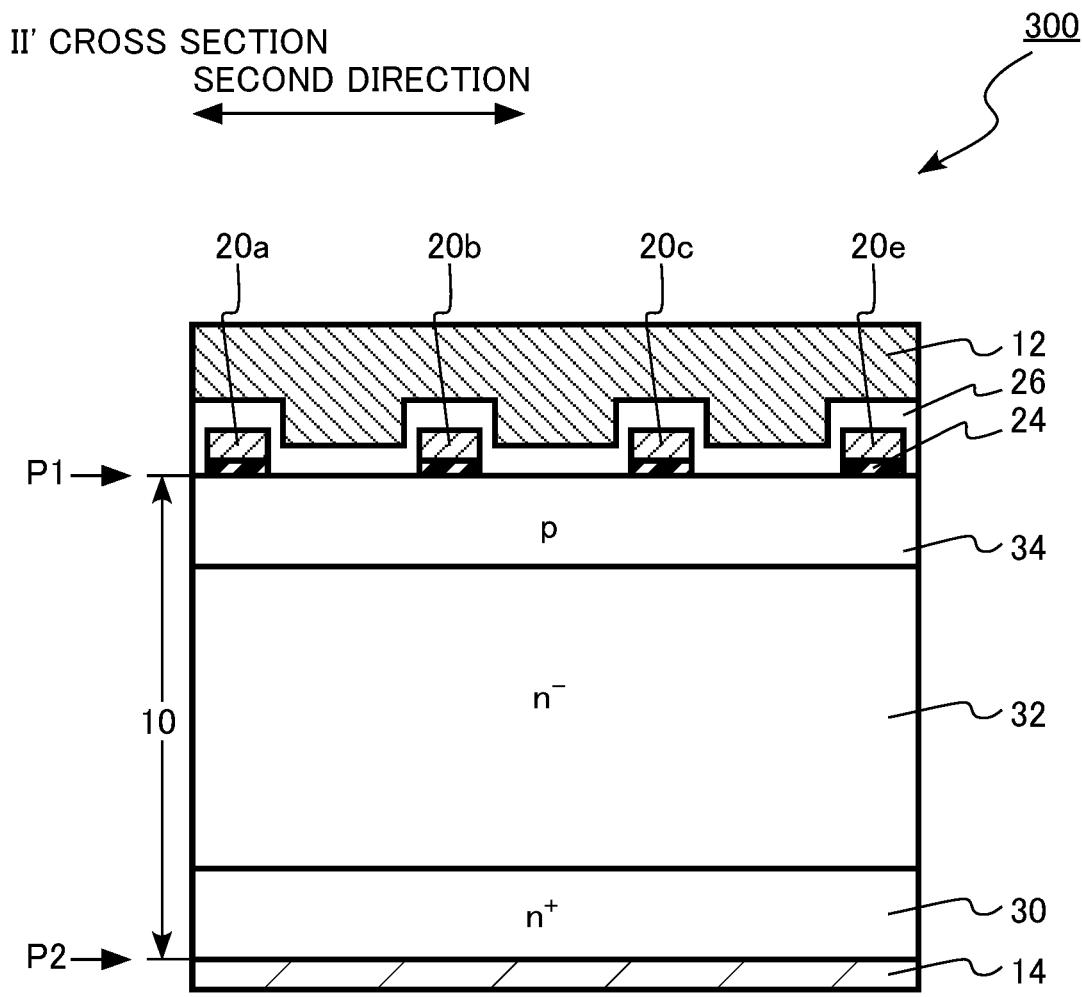
FIG. 18 is an enlarged schematic cross-sectional view of the semiconductor device of the third embodiment.
Figure 19:
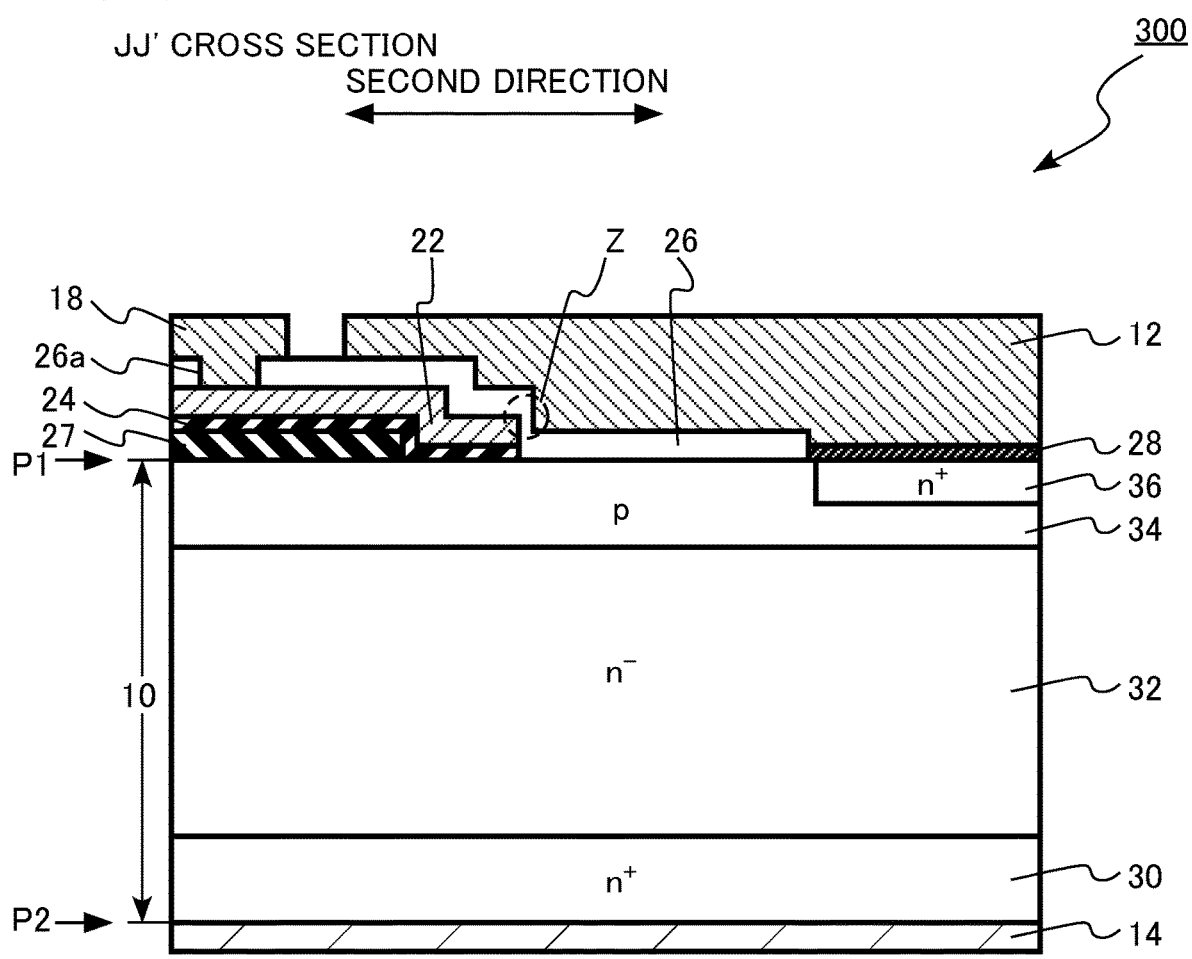
FIG. 19 is an enlarged schematic cross-sectional view of the semiconductor device of the third embodiment.

FIGS. 17, 18, and 19 are enlarged schematic cross-sectional views of the semiconductor device of the third embodiment. FIG. 17 is a cross-sectional view taken along the line HH' of FIG. 16. FIG. 18 is a cross-sectional view taken along the line II' of FIG. 16. FIG. 19 is a cross-sectional view taken along the line JJ' of FIG. 16.

The semiconductor device of the third embodiment is a planar gate type vertical MOSFET 300 using silicon carbide. The MOSFET 300 is, for example, a DIMOSFET.

The MOSFET 300 includes a silicon carbide layer 10, a source electrode 12 (first electrode), a drain electrode 14 (second electrode), a gate electrode pad 16, a metal wiring line 18, a first gate electrode 20a, a second gate electrode 20b, a third gate electrode 20c, a fourth gate electrode 20d, a fifth gate electrode 20e, a sixth gate electrode 20f, a gate wiring line 22, a gate insulating layer 24, an interlayer insulating layer 26, a field insulating layer 27, and a silicide layer 28. The source electrode 12 has a first portion 12a and a third portion 12c. The interlayer insulating layer 26 has a contact hole 26a. Hereinafter, the first gate electrode 20a, the second gate electrode 20b, the third gate electrode 20c, the fourth gate electrode 20d, the fifth gate electrode 20e, and the sixth gate electrode 20f may be simply referred to collectively as a gate electrode 20.

The $n^+$-type source region 36 is provided between the source electrode 12 and the body region 34. The source region 36 is provided between the body region 34 and the first face P1.

The source region 36 extends in the first direction, for example, in a region between the two gate electrodes 20. The source region 36 extends in the first direction, for example, in a region between the first gate electrode 20a and the second gate electrode 20b. The source region 36 extends in the first direction, for example, in a region between the third gate electrode 20c and the fifth gate electrode 20e.

The $p^+$-type body contact region 40 is provided between the source electrode 12 and the body region 34. The body contact region 40 is provided between the body region 34 and the first face P1.

The body contact region 40 extends in the first direction, for example, in a region between the two gate electrodes 20. The body contact region 40 extends in the first direction, for example, in a region between the second gate electrode 20b and the third gate electrode 20c.

As shown in FIG. 16, the distance between the first gate electrode 20a and the second gate electrode 20b in the second direction in a first region R1 is defined as S1. In addition, the distance between the first gate electrode 20a and the second gate electrode 20b in the second direction in a second region R2 closer to the gate wiring line 22 than the first region R1 is defined as S2.

In addition, as shown in FIG. 16, the distance between the second gate electrode 20b and the third gate electrode 20c in the second direction in the first region R1 is defined as S3. In addition, the distance between the second gate electrode 20b and the third gate electrode 20c in the second direction in the second region R2 is defined as S4.

The MOSFET 300 satisfies the following Expression 1, Expression 2, and Expression 3.

$$S1 < S3 \quad \text{(Expression 1)}$$

$$S1 < S2 \quad \text{(Expression 2)}$$

$$S3 > S4 \quad \text{(Expression 3)}$$

In addition, the MOSFET 300 satisfies, for example, the following Expression 4.

$$S1 < S4 \quad \text{(Expression 4)}$$

In addition, the MOSFET 300 satisfies, for example, the following Expression 5.

$$S2 < S3 \quad \text{(Expression 5)}$$

In addition, the MOSFET 300 satisfies, for example, the following Expression 6.

$$0.8 \times S2 < S4 < 1.2 \times S2 \quad \text{(Expression 6)}$$

In addition, the MOSFET 300 satisfies, for example, the following Expression 7.

$$2 \times S1 < S3 \quad \text{(Expression 7)}$$

In addition, the MOSFET 300 satisfies, for example, following Expression 8.

$$S1 + S3 = S2 + S4 \quad \text{(Expression 8)}$$

The source electrode 12 has a first portion 12a and a third portion 12c.

The first portion 12a is disposed, for example, between the first gate electrode 20a and the second gate electrode 20b. The first portion 12a is disposed, for example, between the third gate electrode 20c and the fifth gate electrode 20e. The first portion 12a is in contact with the silicide layer 28 provided on the source region 36.

The third portion 12c is disposed, for example, between the second gate electrode 20b and the third gate electrode 20c. The third portion 12c is in contact with the silicide layer 28 provided on the body contact region 40.

According to the MOSFET 300 of the third embodiment, as shown in FIG. 19, the thickness of the interlayer insulating layer 26 in the region Z is larger than that in the MOSFET 900 of the comparative example, as in the first embodiment. Therefore, a short circuit between the gate wiring line 22 and the source electrode 12 is suppressed. As a result, the MOSFET 300 that can be scaled down can be realized.

According to the MOSFET 300 of the third embodiment, as in the first embodiment, a problem such as unstable operation or reduced reliability of the gate insulating layer 24 is less likely to occur. Therefore, the MOSFET 300 having stable characteristics and improved reliability is realized.

In addition, in the MOSFET 300, the area of the source region 36 electrically connected to the source electrode 12 is larger than that in the MOSFET 100 of the first embodiment. Therefore, the on-current of the transistor is larger than that in the MOSFET 100.

In addition, in the MOSFET 300, the area of the body contact region 40 electrically connected to the source electrode 12 is larger than that in the MOSFET 100 of the first embodiment. Therefore, for example, the avalanche tolerance is larger than that of the MOSFET 100.

As described above, according to the third embodiment, a MOSFET that can be scaled down is realized. In addition, since characteristic fluctuations are suppressed, a MOSFET with improved reliability is realized.

In the first to third embodiments, a planar gate type MOSFET in which the gate electrode 20 and the gate insulating layer 24 are provided on the first face P1 of the silicon carbide layer 10 has been described as an example. However, the MOSFET can be a trench gate type MOSFET in which the gate electrode 20 and the gate insulating layer 24 are embedded in a trench formed in the silicon carbide layer 10. In the case of a trench gate type MOSFET, for example, the gate electrode 20 is drawn out from the end of the trench onto the first face P1 of the silicon carbide layer 10 and then connected to the gate wiring line 22.

In the first to third embodiments, the case where the semiconductor device is a MOSFET has been described as an example. However, the semiconductor device may be an insulated gate bipolar transistor (IGBT). For example, it is possible to form an IGBT by providing a $p^+$-type collector region instead of the $n^+$-type drain region 30 of the MOSFET 100 of the first embodiment.

In the first embodiment, a MOSFET in which one Schottky region is provided for every three gate electrodes 20 has been described as an example, and in the second embodiment, a MOSFET in which one Schottky region is provided for every four gate electrodes 20 has been described as an example. However, it is also possible to use a MOSFET in which one Schottky region is provided for every five or more gate electrodes 20.

In the first to third embodiments, the case of 4H—SiC has been described as an example of the crystal structure of SiC. However, the embodiments can also be applied to devices using SiC having other crystal structures, such as 6H—SiC and 3C—SiC. In addition, a face other than the (0001) face can also be applied as the surface of the silicon carbide layer 10.

In the first to third embodiments, the case where the first conductive type is n type and the second conductive type is p type has been described as an example. However, the first conductive type can be p type and the second conductive type can be n type. When the first conductive type is p type and the second conductive type is n type, the MOSFET is a p-channel type MOSFET having holes as carriers.

In the first to third embodiments, aluminum (Al) is exemplified as a p-type impurity, but boron (B) can also be used. In addition, although nitrogen (N) and phosphorus (P) are exemplified as n-type impurities, arsenic (As), antimony (Sb), and the like can also be applied.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first electrode;
   a second electrode;
   a silicon carbide layer provided between the first electrode and the second electrode and including a first silicon carbide region of a first conductive type, a second silicon carbide region of a second conductive type provided between the first electrode and the first silicon carbide region, and a third silicon carbide region of the first conductive type provided between the first electrode and the second silicon carbide region;

a first gate electrode provided between the first electrode and the silicon carbide layer and extending in a first direction;

a second gate electrode provided between the first electrode and the silicon carbide layer and extending in the first direction;

a third gate electrode provided between the first electrode and the silicon carbide layer and extending in the first direction;

a gate wiring line provided between the first electrode and the silicon carbide layer and extending in a second direction crossing the first direction, the first gate electrode, the second gate electrode, and the third gate electrode being connected to the gate wiring line; and a gate insulating layer provided between the first gate electrode and the silicon carbide layer, between the second gate electrode and the silicon carbide layer, and between the third gate electrode and the silicon carbide layer, wherein, assuming that a distance between the first gate electrode and the second gate electrode in the second direction in a first region is S1, a distance between the first gate electrode and the second gate electrode in the second direction in a second region closer to the gate wiring line than the first region is S2, a distance between the second gate electrode and the third gate electrode in the second direction in the first region is S3, and a distance between the second gate electrode and the third gate electrode in the second direction in the second region is S4, following Expression 1, Expression 2, and Expression 3 are satisfied, $$S1 < S3 \qquad \text{(Expression 1)}$$

$$S1 < S2 \qquad \text{(Expression 2)}$$

$$S3 > S4 \qquad \text{(Expression 3)}.$$

2. The semiconductor device according to claim 1, wherein following Expression 4 is satisfied, $$S1 < S4 \qquad \text{(Expression 4)}.$$

3. The semiconductor device according to claim 2, wherein following Expression 5 is satisfied, $$S2 < S3 \qquad \text{(Expression 5)}.$$

4. The semiconductor device according to claim 3, wherein following Expression 6 is satisfied, $$0.8 \times S2 < S4 < 1.2 \times S2 \qquad \text{(Expression 6)}.$$

5. The semiconductor device according to claim 4, wherein following Expression 7 is satisfied, $$2 \times S1 < S3 \qquad \text{(Expression 7)}.$$

6. The semiconductor device according to claim 5, wherein following Expression 8 is satisfied, $$S1 + S3 = S2 + S4 \qquad \text{(Expression 8)}.$$

7. The semiconductor device according to claim 1, wherein following Expression 5 is satisfied, $$S2 < S3 \qquad \text{(Expression 5)}.$$

8. The semiconductor device according to claim 1, wherein following Expression 6 is satisfied, $$0.8 \times S2 < S4 < 1.2 \times S2 \qquad \text{(Expression 6)}.$$

9. The semiconductor device according to claim 1, wherein following Expression 7 is satisfied, $$2 \times S1 < S3 \qquad \text{(Expression 7)}.$$

10. The semiconductor device according to claim 1, wherein following Expression 8 is satisfied, $$S1 + S3 = S2 + S4 \qquad \text{(Expression 8)}.$$

11. The semiconductor device according to claim 1, further comprising:

an insulating layer provided between the first gate electrode and the first electrode, between the second gate electrode and the first electrode, and between the gate wiring line and the first electrode.

12. The semiconductor device according to claim 1, wherein the first electrode has a first portion and a second portion, the first portion is disposed between the first gate electrode and the second gate electrode, and the second portion is disposed between the second gate electrode and the third gate electrode and the second portion is in contact with the first silicon carbide region.

13. The semiconductor device according to claim 1, further comprising:

a fourth gate electrode provided between the first electrode and the silicon carbide layer and extending in the first direction, the first gate electrode being interposed between the second gate electrode and the fourth gate electrode, wherein, assuming that a distance between the fourth gate electrode and the first gate electrode in the second direction in the first region is S5 and a distance between the fourth gate electrode and the first gate electrode in the second direction in the second region is S6, following Expression 9 and Expression 10 are satisfied, $$S5 < S3 \qquad \text{(Expression 9)}$$

$$S5 < S6 \qquad \text{(Expression 10)}.$$

14. The semiconductor device according to claim 13, wherein following Expression 11 is satisfied, $$S1 + S3 + S5 = S2 + S4 + S6 \qquad \text{(Expression 11)}.$$

* * * * *